US005959510A

United States Patent [19]

Moschytz

[11] Patent Number: 5,959,510
[45] Date of Patent: *Sep. 28, 1999

[54] SECOND ORDER FILTER WITH LOW SENSITIVITY TO COMPONENT VALUES AND A METHOD FOR DESIGNING THE SAME

[75] Inventor: George S. Moschytz, Zurich, Switzerland

[73] Assignee: Globespan Technologies, Inc., Red Bank, N.J.

[*] Notice: This patent is subject to a terminal disclaimer.

[21] Appl. No.: 08/874,977

[22] Filed: Jun. 13, 1997

Related U.S. Application Data

[60] Provisional application No. 60/032,810, Dec. 11, 1996.
[51] Int. Cl.⁶ ...................................................... H03H 1/02
[52] U.S. Cl. .......................... 333/172; 327/552; 327/558
[58] Field of Search ............................. 333/172; 327/552, 327/558

[56] References Cited

U.S. PATENT DOCUMENTS 4,523,109   6/1985   Van Roessel ............................. 327/552

OTHER PUBLICATIONS

Moschytz, "A Universal LOW–Q Active–Filter Building Block Suitable for Hybrid–Integrated Circuit Implementation," IEEE Transactions on Circuit Theory, vol. CT–20, No. 1, pp. 37–47, Jan. 1973.
Moschytz et al., *Active Filter Design Handbook*, Wiley & Sons, pp. 123, 124, 130, & 203, 1981.

*Primary Examiner*—Robert Pascal
*Assistant Examiner*—Justin P. Bettendorf
*Attorney, Agent, or Firm*—Thomas, Kayden, Horstemeyer & Risley

[57] ABSTRACT

The present invention provides a second order filter with low sensitivity to component values and a method for designing the filter. The filter is impedance tapered by increasing the impedance of the filter circuit from left to right so as to minimize loading on the first ladder section and to maximize the pole quality factor of the first section. The filter is designed so that the value of the resistor of the second ladder section of the filter is equal to the resistor value of the first section multiplied by a scaling factor r, which is greater than 1. The capacitor of the second ladder section has a value equal to the value of the capacitor of the first ladder section divided by a tapering factor $\rho$, which is also greater than 1. In accordance with the preferred embodiment, the capacitor and resistor tapering factors are equal, i.e., $r=\rho>1$.

16 Claims, 13 Drawing Sheets

SECOND ORDER FILTER WITH LOW SENSITIVITY TO COMPONENT VALUES AND A METHOD FOR DESIGNING THE SAME

CROSS REFERENCE TO RELATED APPLICATION

This application claims priority to and the benefit of the filing data of copending provisional application entitled A SECOND ORDER FILTER WITH LOW SENSITIVITY TO COMPONENT VALUES AND A METHOD FOR DESIGNING THE SAME, assigned Ser. No. 60/032,810, filed Dec. 11, 1996. The above-referenced provisional application is incorporated herein by reference.

FIELD OF THE INVENTION

The present invention relates to a second order filter with low sensitivity to component value variations and to a method for designing such filters. More particularly, the present invention relates to a second order filter which has been desensitized with sect to component values by impedance scaling the second filter section upwards to minimize loading on the first filter section, thereby maximizing the quality factor of the passive pole.

BACKGROUND OF THE INVENTION

It is well known to minimize the sensitivity of filter characteristics to values of the gain elements by minimizing the gain-sensitivity product (GSP) of the filter. For example, "Active Filter Design Handbook", by G. S. Moschytz and P. Horn, 1981, discloses using a computer program to design biquad active filters. The computer program presents flow-chart listings to the designer and allows the designer to enter the specifications for the filter in terms of pole and zero frequencies and quality factors. In response to the data input by the designer, the computer program determines the minimum gain-sensitivity product (GSP). However, since the resistor values must be selected so as to minimize the GSP, this method results in only partial impedance tapering, namely, impedance tapering with respect to the capacitors of the circuit. Therefore, this method only minimizes the sensitivity of the filter characteristics to values of the gain elements.

Accordingly, a need exists for a method of designing filters which minimizes the sensitivity of the filter characteristics with respect to resistor and capacitor values while also minimizing the sensitivity of the filter to gain.

SUMMARY OF THE INVENTION

The present invention provides a method for designing a second order active filter which is substantially desensitized with respect to components, including gain elements, by scaling the second filter section (the active section) of the filter circuit upwards so as to minimize the loading on the first filter section (the passive section) such that the pole quality factor of the passive section is maximize. This is accomplished by selecting a resistive value for the active section of the filter which is equal to the resistive value of the passive filter section multiplied by a tapering factor, r, which is greater than 1. The capacitor value of the active section of the filter is equal to the capacitor value of the passive section divided by a tapering factor, p, which is also greater than 1. In accordance with the preferred embodiment of the present invention, r=ρ>1.

Accordingly, it is an object of the present invention to provide a second order filter with minimum sensitivity to component values.

It is another object of the present invention to provide a second order filter which can be designed and manufactured in a relatively short period of time due to greater freedom in selecting the circuit components.

It is another object of the present invention to provide a method for designing discrete component active RC filters which have low sensitivity to component value variations.

It is yet another object of the present invention to provide a filter with relatively wide-tolerance components which does not require tuning.

It is yet another object of the present invention to provide a filter with low sensitivity to component values which can be comprised of discrete components or, alternatively, which can be manufactured as an integrated circuit.

It is yet another object of the present invention to provide a filter which can be constructed of discrete components and which is particularly well suited for use with digital signal processors.

It is yet another object of the present invention to provide a filter which can be constructed at relatively low cost.

It is yet another object of the present invention to provide a filter which has low power consumption.

These and other objects of the present invention will become apparent from the following description, drawings and claims.

DETAILED DESCRIPTION OF THE INVENTION

Figure 1A:
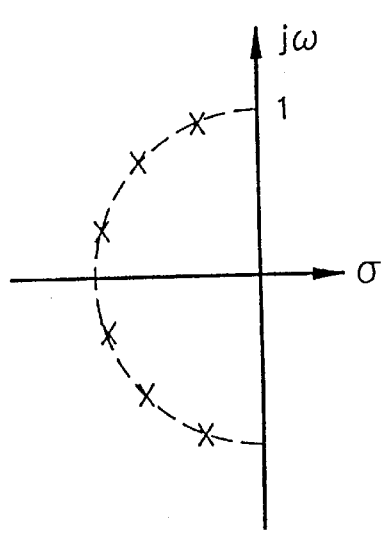
FIGS. 1A and 1B illustrate the root loci in the s-plane for sixth-order Butterworth and Chebychev filters, respectively.

The present invention is particularly well suited for, but not limited to, designing second order discrete-component active RC filters due to the freedom the method of the present invention provides in selecting filter components. Discrete component active RC filters have a distinct edge over their high-tech counterparts (e.g., Digital and DSP, switched-capacitor and switched-current, continuous-time IC) in that the former provides, for example: (1) fast turn-around time for design and manufacture; (2) low power requirements (e.g., only one operational amplifier required per filter); (3) low cost (e.g., no need for AD/DA converters, anti-aliasing filters, etc.); and (4) moderate size in that they are smaller than LC filters but larger than IC chips.

In accordance with the present invention, a method for designing second order filters is provided which allows second order RC filters to be manufactured with relatively wide-tolerance RC components while maintaining the cost-effectiveness of these types of filters. However, it will become apparent to those skilled in the art after reading the present application that the impedance tapering method of the present invention is also applicable and is equally advantageous to filters manufactured as integrated circuits. It will also become apparent to those skilled in the art that, although the present invention is described below with respect to active-RC allpole filters, the present invention is not limited to allpole filters, and that the present invention is applicable to filters having both poles and zeros as well as to passive filters. Furthermore, it will become apparent to those skilled in the art that the present invention is not limited to any particular types of filters. The method of the present invention can be used to design, for example, lowpass filters, bandpass filters, band-reject filters, highpass filters, notch filters and state-variable biquad filters, as well as specific types of these filters, such as Butterworth filters, Chebyshev filters, Bessel filters, Optimal filters, Parabolic filters and Elliptic filters.

In the interest of brevity, however, the present invention will be described only with respect to Butterworth and Chebyshev filters and, more specifically, with respect to active RC allpole lowpass Butterworth and Chebyshev filters. However, it will become apparent to those skilled in the art after reading the present application that the present invention is in no way limited to the filters discussed below.

The present invention will now be described with respect to the preferred embodiments. In designing low-sensitivity active RC allpole filters, the filter designer generally has three factors to consider:

(i) Component sensitivity increases with inband ripple. Thus, the specifications should be geared towards a low-ripple (or, if possible, maximally-flat) amplitude response. This, in turn, decreases the pole quality factors (Qs);

(ii) Component sensitivity increases with the filter order. The latter should therefore be held as low as possible consistent with the filter specifications. Fortunately, this is standard procedure in filter design and minimizes filter cost;

(iii) Impedance tapering minimizes sensitivity. Using the impedance tapering method of the present invention, the filter circuit can be directly and significantly desensitized with respect to component values and gain at no extra cost. All that is required is that the designer make a judicious choice of component values.

Since it is well known that factors (i) and (ii) must be taken into consideration, and since the present invention is primarily directed to the factor set forth in paragraph (iii), only factor (iii) will be discussed in detail below.

In accordance with the present invention, it has been determined that the larger the impedance tapering factors can be made, the less sensitive the filter circuit will be to component values, i.e., the circuit will have a higher tolerance to variations of the component values. However, the impedance tapering factor cannot be made arbitrarily large because the maximum possible degree of impedance tapering depends directly on the values of the transfer function coefficients. Therefore, in accordance with the present invention, bounds on the impedance tapering factors as a function of the transfer function coefficients will be provided below. Sensitivity expressions and design equations are also given below and data from P SPICE Monte Carlo simulations is provided which shows the effectiveness of the impedance tapering method of the present invention as a means of reducing filter sensitivity to component values and amplifier gain. Because the impedance tapering factors cannot be chosen arbitrarily (since they depend on the transfer function coefficients), a detailed design-procedure for selecting the impedance tapering factors is provided below.

Before describing the design procedure of the present invention, sensitivity expressions which define the sensitivity of the transfer function coefficients to component values will be derived and the sensitivity of filters to component values will be shown. In order to demonstrate the sensitivity of filters to component values and to filter order, characteristics of second order, third order, sixth order and nth order filters will be investigated. Once the sensitivity of filters to component values and filter order has been demonstrated, the sensitivity expressions will be used to derive design equations for designing a second order filter with low sensitivity to component values. Finally, the method of the present invention of designing second order filters with low sensitivity to component values will be described using the design equations.

SENSITIVITY OF THE TRANSFER FUNCTION TO COEFFICIENT VARIATIONS

The transfer function $T(s)$ of an nth-order, allpole, lowpass filter is:

$$T(s) = \frac{N(s)}{D(s)} = \frac{\beta a_0}{a_n s^n + a_{n-1} s^{n-1} + \cdots a_i s^i + \cdots a_1 s + a_0} \quad \text{(Eq. 1)}$$

Figure 1B:
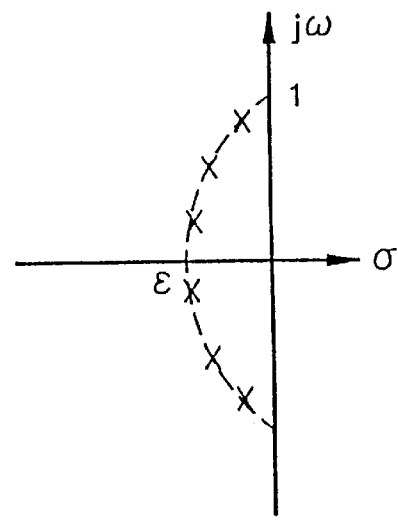
Figure 2A:
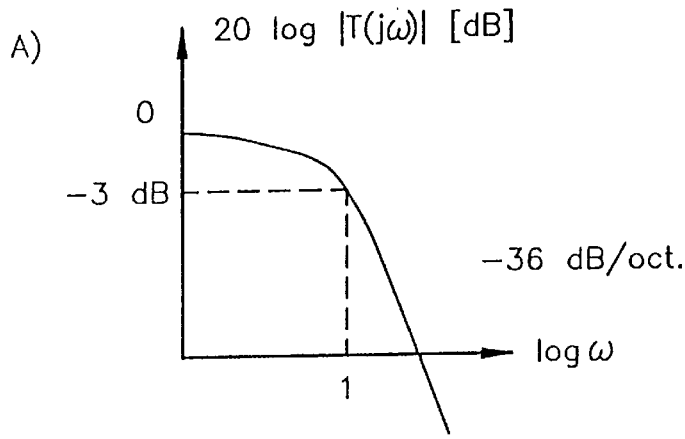
FIGS. 2A and 2B illustrate the amplitude responses for the sixth-order Butterworth and Chebychev filters having the root loci shown in FIGS. 1$a$ and 1$b$, respectively.
Figure 2B:
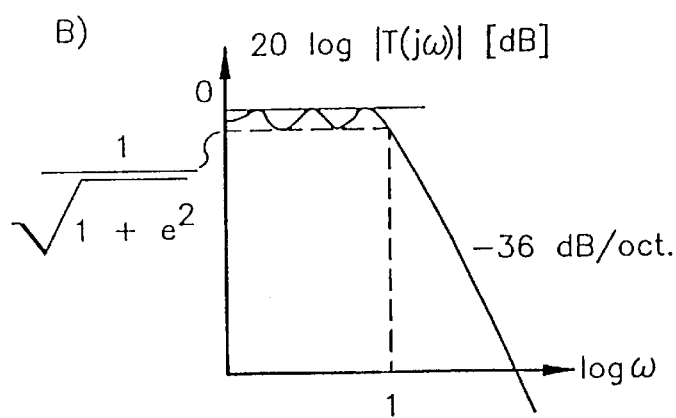

The frequency response of the filter depends on the coefficients $a_i$ of the polynomial $D(s)$. These coefficients are available from any filter handbook or CAD program and determine the location of the poles (i.e., the roots of $D(s)$) in the s-plane. For example, the poles of a sixth-order Butterworth lowpass filter will lie on a semicircle about the origin in the left half plane and those of a Chebyshev filter will lie on an ellipse. The root loci for these particular filters are shown in FIGS. 1a and 1b, respectively. The larger the ripple of the Chebyshev filter, the smaller the eccentricity $\epsilon$ will be (i.e., the closer the poles will be to the $j\omega$ axis) and the higher the corresponding pole Qs will be. It should be noted, however, that the slope of the asymptotic responses of these two allpole filters of equal order n will be the same, irrespective of the inband ripple. This is shown in the corresponding amplitude responses shown qualitatively in FIGS. 2a and b, respectively. The ripple of the Chebyshev filter is equal to $(1+e^2)^{-\frac{1}{2}}$ where the ellipse eccentricity $\omega = \tanh(1/n \sinh^{-1} 1/e)$.

To obtain the sensitivity of the transfer function $T(s)$ (equation 1) to variations of the circuit components, some basic relations in sensitivity theory will be briefly discussed. The relative sensitivity of a function $F(x)$ to variations of a variable x is defined as $$S_x^{F(x)} = \frac{dF/F}{dx/x} = \frac{dF(x)}{dx} \cdot \frac{x}{F(x)} = \frac{d[\ln F(x)]}{d[\ln x]} \quad \text{(Eq. 2)}$$

Thus, the relative variation of $F(x)$ caused by a relative change of x is given by $$\frac{\Delta F(x)}{F(x)} = S_x^{F(x)} \frac{\Delta x}{x} \quad \text{(Eq. 3)}$$

where the difference values $\Delta F$ and $\Delta x$, rather than their differentials $dF$ and $dx$, are used to imply measurable relative quantities, e.g., as given in percentages of their nominal values. The amplitude and phase sensitivity expressions for T(s) are obtained by letting s=jω, where $$T(s)|_{s=j\omega} = |T(j\omega)| \cdot e^{j\phi(\omega)} \quad \text{(Eq. 4)}$$
$$\ln T(j\omega) = \ln|T(j\omega)| + j\phi(\omega)$$

and $$= \alpha(\omega) + j\phi(\omega) \quad \text{(Eq. 5)}$$

$\alpha(\omega)$ is the amplitude response in Nepers, and $\phi(\omega)$ is the phase response in degrees. Thus, with equation 2, the following is obtained:

$$S_s^{T(\omega)} = \frac{d[\ln T(j\omega)]}{d(\ln x)} = \frac{d\alpha(\omega)}{d\ln x} + j\frac{d\phi(\omega)}{d\ln x} \quad \text{(Eq. 6)}$$

With the symbol $$S_x^{F(x)} = \frac{dF(x)}{dx/x} = \frac{dF(x)}{d\ln x} \quad \text{(Eq. 7)}$$

signifying the semi-relative sensitivity of a function F(x) to a relative change in x. The amplitude sensitivity and phase sensitivity expressions for T(s) are given by Equations 8 and 9, respectively, as follows:

$$\text{Re}\{S_x^{T(j\omega)}\} = S_x^{\alpha(\omega)} \quad \text{(Eq. 8)}$$

$$\text{Im}\{S_x^{T(j\omega)}\} = S_x^{\phi(\omega)} \quad \text{(Eq. 9)}$$

The amplitude sensitivity in Equation 8 is given in Nepers [N] per relative change in a real variable x, i.e., $$\Delta\alpha(\omega) = S_x^{\alpha(\omega)} \frac{\Delta x}{x} \quad \text{(Eq. 10)}$$
$$= \text{Re}\{S_x^{T(j\omega)}\}\frac{\Delta x}{x} \; [N]$$

Converting the amplitude sensitivity from Nepers to dB per percent component change, the following expression is obtained:

$$\Delta A(\omega) \; [\text{dB}] = \frac{20}{\ln 10}\Delta\alpha(\omega) \; [N] = 8.68 \cdot \Delta(\omega) \; [N] \quad \text{(Eq. 11)}$$

Thus, for example, an amplitude variation of 0.1 N corresponds to 0.868 dB, or an amplitude variation of approximately 1 dB.

From the sensitivity expressions presented above, it follows that the relative change of a transfer function T(s), as given, for example, in equation 1, to the variations of its coefficients $a_i$, can be written as:

$$\frac{\Delta T(s)}{T(s)} = \sum_{i=0}^{n} S_{a_i}^{T(s)} \frac{\Delta a_i}{a_i} \quad \text{(Eq. 12)}$$

The relative sensitivity function defined by equation 2 is very useful because with it, the sensitivity of many commonly occurring function types can readily be obtained and compared. To do so, the following simple and easily derivable relationships are used:

$$S_x^{u(x)\cdot v(x)} = S_x^{u(x)} + S_x^{v(x)} \quad \text{(Eq. 13)}$$

$$S_x^{u(x)/v(x)} = S_x^{u(x)} - S_x^{v(x)} \quad \text{(Eq. 14)}$$

$$S_x^{y(x)+c} = \frac{y(x)}{y(x)+c}S_x^{y(x)} \quad \text{(Eq. 15)}$$

$$S_x^{c\cdot y(x)} = S_x^{y(x)} \quad \text{(Eq. 16)}$$

$$S_x^{c(x)} = 1 \quad \text{(Eq. 17)}$$

$$S_x^{y^n(x)} = nS_x^{y(x)} \quad \text{(Eq. 18)}$$

$$S_{x^n}^{y(x)} = \frac{1}{n} = S_x^{y(x)} \quad \text{(Eq. 19)}$$

With equations 14, 15 and 16, it readily follows from equation 1 that $$S_{a_i}^{T(s)} = S_{a_i}^{N(s)} - S_{a_i}^{D(s)} \quad i = 0, 1, 2, \ldots n \quad \text{(Eq. 20)}$$

Thus $$S_{a_0}^{T(s)} = 1 - \frac{a_0}{D(s)} \quad \text{(Eq. 21)}$$

and for $i \neq 0$ $$S_{a_i}^{T(s)} = \frac{-a_i s^i}{D(s)} \quad \text{(Eq. 22)}$$

Letting $$F_i(s) = \frac{-a_i s^i}{D(s)} \quad i = 1, 2, \ldots n \quad \text{(Eq. 23)}$$

and, with equation 21

$$F_0(s) = \frac{a_n s^n = a_{n-1} + \ldots a_1 s}{D(s)} \quad \text{(Eq. 24)}$$

the following is obtained:

$$\Delta\alpha(\omega) = \text{Re}\left\{\sum_{i=0}^{n} F_i(s)\frac{\Delta a_i}{a_i}\right\}_{s=j\omega} \quad \text{(Eq. 25)}$$
$$= \text{Re}\left\{\sum_{i=0}^{n} F_i(j\omega)\frac{\Delta a_i}{a_i}\right\}$$

At this point, two important properties of the coefficients $a_i$ of the denominator polynomial D(s) of a filter are recalled, namely:

(i) the coefficients $a_i$ of D(s) must be real (this applies also to the numerator polynomial) resulting in either real or complex-conjugate poles (and zeros); and (ii) the coefficients $a_i$ of D(s) must be positive (this is one of the conditions for a Hurwitz polynomial) resulting in only left-half plane (LHP) poles (i.e. D(s) must be a Hurwitz polynomial).

From point (i) above, it follows that the $\Delta a_i/a_i$ terms in equation 25 are so that this expression can be rewritten as:

$$\Delta\alpha(\omega) = \sum_{i=0}^{n} \text{Re}\{F_i(j\omega)\} \frac{\Delta a_i}{a_i} \quad \text{(Eq. 26)}$$

$$= \sum_{I=0}^{n} f_i(\omega) \frac{\Delta a_i}{a_i}$$

where, for $i = 1, 2, \ldots n$ $$f_i(\omega) = \text{Re}\left\{\frac{-a_i s^i}{D(s)}\right\}_{s=j\omega} \quad \text{(Eq. 27)}$$

and $$f_0(\omega) = \text{Re}\left\{1 - \frac{a_0}{D(s)}\right\}_{s=j\omega} \quad \text{(Eq. 28)}$$

The functions $f_i(\omega)$ are frequency-dependent multiplicands of the coefficient variations $\Delta a_i/a_i$ which cause the amplitude deviation $\Delta\alpha(\omega)$. They depend only on the initial transfer function $T(s)$ of a given filter, or, more specifically, on its denominator coefficients $a_i$.

The third-order allpole transfer function given in terms of the polynomial coefficients $a_i$ (i=0,1,2) is:

$$T(s) = \frac{N(s)}{D(s)} \frac{\beta \cdot a_0}{s^3 + a_2 s^2 + a_1 s + a_0} \quad \text{(Eq. 29)}$$

With the negative-real pole $\gamma$ and the complex-conjugate pole pair given in terms of the pole frequency $\omega_p$ and the pole Q, $q_p$, this becomes:

$$T(s) = \frac{\beta\gamma\omega_p^2}{\left(s^2 + \frac{\omega_p}{q_p}s + \omega_p^2\right)(s + \gamma)} \quad \text{(Eq. 30)}$$

This describes a third-order lowpass filter where $\beta$ is the dc gain of its active-RC realization. Assuming that the required filter loss specifications are those given in FIG. 3, the frequency bands correspond to those of a transmit lowpass filter used in ADSL (Asymmetrical Digital Subscriber-Loop) data transmission systems. Typically $A_{max}=0.5$ dB, $A_{min}=25$ dB, and $\beta=4$. For these specifications, the filter coefficients given in Table 1 and the $\gamma$, $\omega_p$ and $q_p$ values given in Table 2 are obtained (e.g., from filter tables or a CAD filter program) as follows.

| Filter Type Passband ripple (dB) | a2 | a1 | a0 |
|---|---|---|---|
| Butterworth (0.5) | $1.43 \times 10^6$ | $1.02 \times 10^{12}$ | $3.64 \times 10^{17}$ |
| Chebyshev (0.5) | $6.3 \times 10^6$ | $3.88 \times 10^{11}$ | $9.09 \times 10^{16}$ |

Table 1: Coefficients of 3rd-order lowpass filter
Table 2: Pole frequency and Q (i.e. $\omega p$ and $qp$) for the poles of a 3rd order lowpass filter with denominator:

$$D(s) = s^3 + a_2 s^2 + a_1 s + a_0 = \left(s^2 + \frac{\omega_p}{q_p}s + \omega_p^2\right)(s + \gamma)$$

| Filter Type | $\gamma$ | $\omega p$ | $qp$ |
|---|---|---|---|
| Butterworth (0.5 dB ripple) | $713.727 \times 10^3$ | $713.727 \times 10^3$ | 1.0 |
| Chebyshev (0.5 dB ripple) | $314.891 \times 10^3$ | $537.264 \times 10^3$ | 1.71 |

Figure 4A:
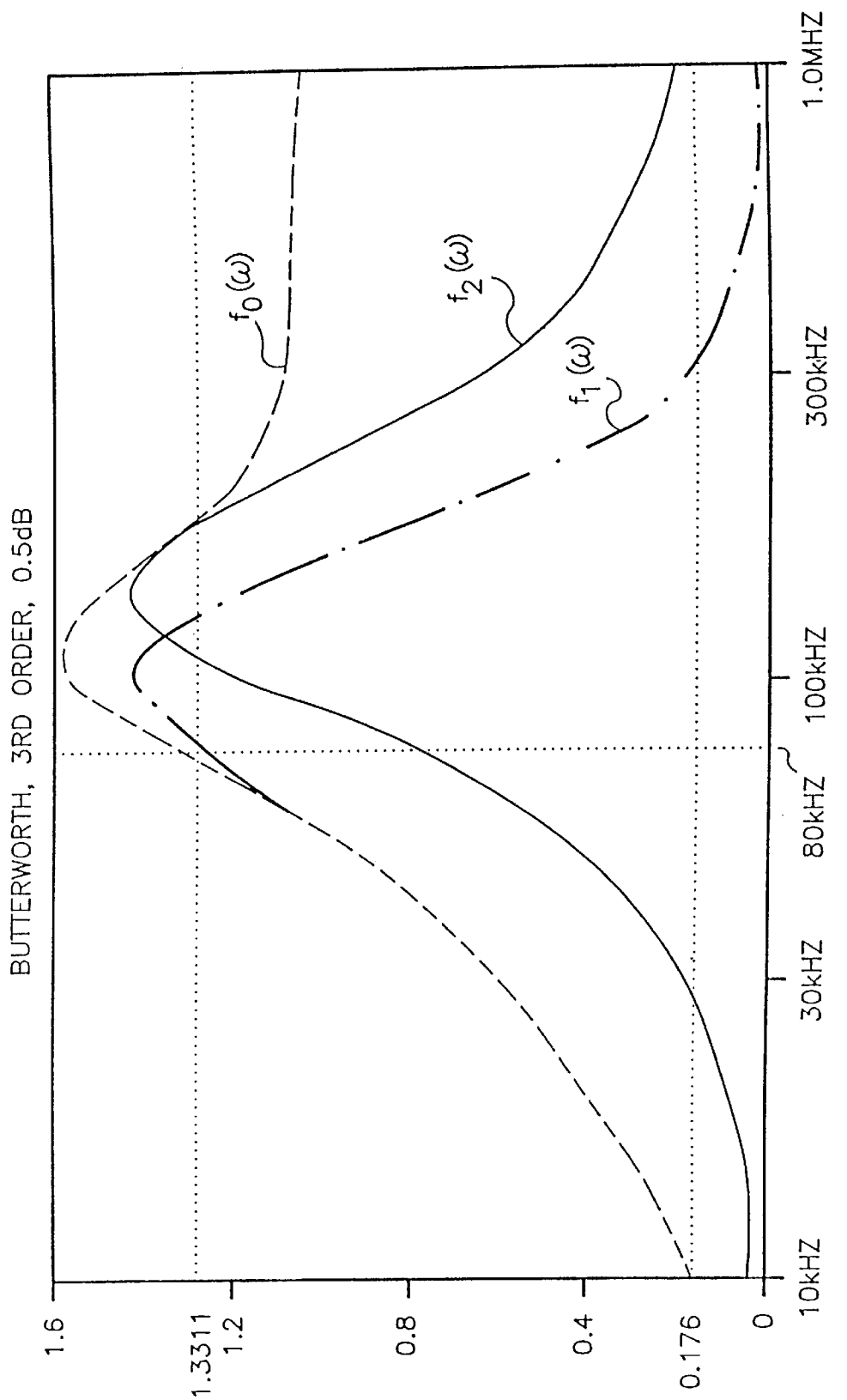
FIGS. 4A and 4B illustrate the frequency responses for a third-order Butterworth filter and a third-order Chebychev filter, respectively.
Figure 4B:
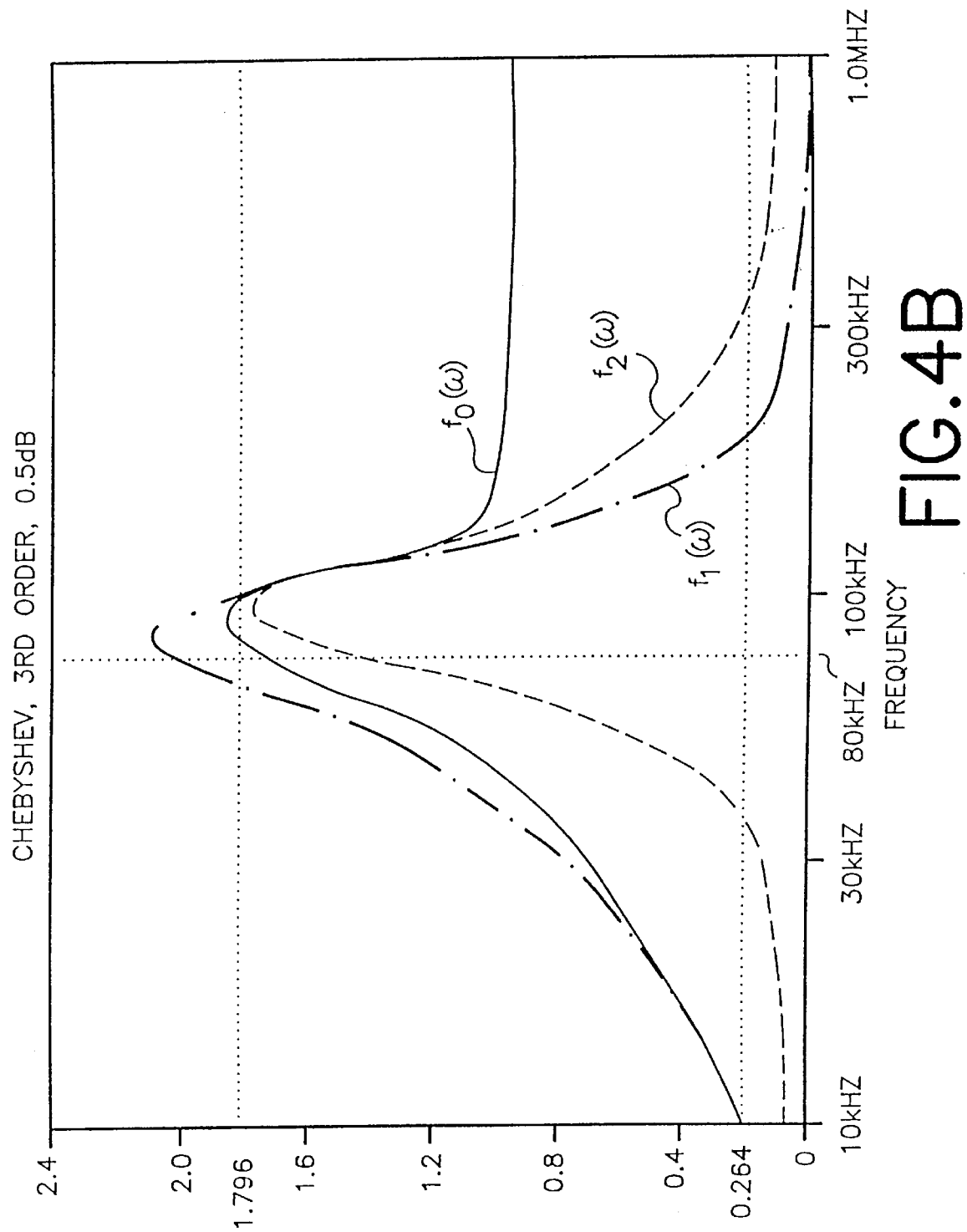

Calculating the fuctions (see eqs. (27) and (28)):

$$f^i(\omega) = \text{Re}\left\{\frac{-a_i s^i}{D(s)}\right\}_{s=j\omega} \quad i = 1, 2 \quad \text{(Eq. 31)}$$

and $$f_0(\omega) = \text{Re}\{S_{a_0}^{T(s)}\}_{s=j\omega} = \text{Re}\left\{1 - \frac{a_0}{D(s)}\right\}_{s=j\omega} \quad \text{(Eq. 32)}$$

$$= \text{Re}\left\{\frac{a_3 s^3 + a_2 s^2 + a_1 s}{a_3 s^3 + a_2 s^2 + a_1 s + a_0}\right\}_{s=j\omega}$$

and where $a_3=1$, the functions plotted in FIGS. 4a and 4b are obtained. It should be noted that the highest sensitivity of the amplitude response $\alpha(\omega)$ to coefficient variations is just beyond the cutoff frequency of 80 khz. Moreover, the sensitivity of the Chebyshev transfer function to coefficient variations is larger than that of the Butterworth filter (the maximum occurs for $f_0(\omega)$ [Butterworth] with approximately 1.6, and for $f_1(\omega)$ [Chebyshev] with approximately 2.0). The distribution of the three functions along the frequency axis for the two filters is similar, primarily because the pole locations of the two filters do not differ greatly. Within the passband, i.e., below 80 khz, the sensitivity curve of the a: coefficient, i.e., $f_2(\omega)$, is lowest for both filters whereas for the $a_1$ and $a_0$ coefficients (i.e., $f_1(\omega)$ and $f_0(\omega)$) it is approximately the same.

The transfer function of a 6th-order Butterworth and Chebyshev allpole, lowpass filter is expressed as:

$$T(s) = \frac{\beta a_0}{s^6 + a_5 s^5 + a_4 s^4 + a_3 s^3 + a_2 s^2 + a_1 s + a_0} \quad \text{(Eq. 33)}$$

Figure 3:
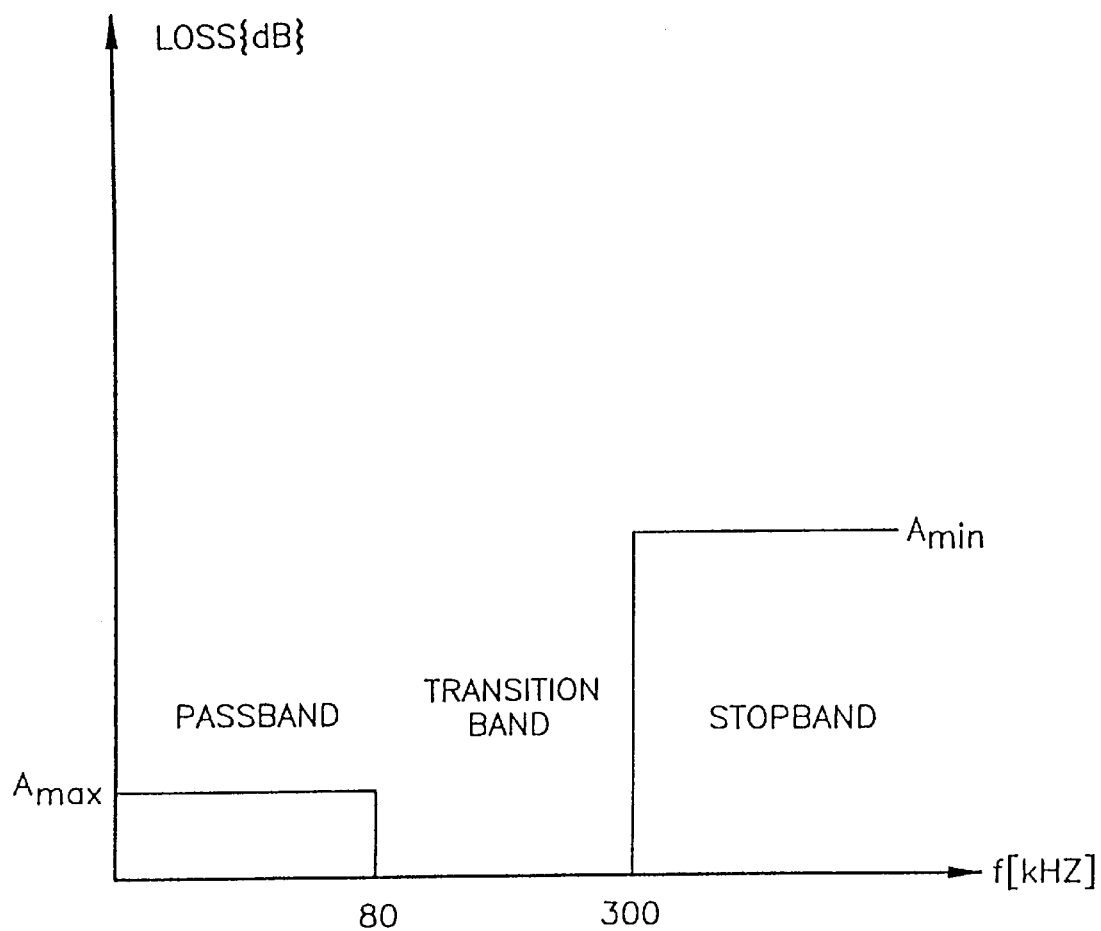
FIG. 3 illustrates the loss specifications for a third-order lowpass active RC filter.

Assuming the filter specifications in FIG. 3 to be $A_{max}=0.1$ dB and $A_{min}=50$ dB, the following filter coefficients are obtained:

TABLE 3

Coefficients of 6th-order lowpass filter

| Filtertype Passband ripple (dB) | a5 | a4 | a3 | a2 | a1 | a0 |
|---|---|---|---|---|---|---|
| Butterworth (0.1) | $2.66 \times 10^6$ | $3.53 \times 10^{12}$ | $2.97 \times 10^{18}$ | $1.67 \times 10^{24}$ | $5.94 \times 10^{29}$ | $1.06 \times 10^{35}$ |
| Chebyshev (0.1) | $8.61 \times 10^5$ | $7.49 \times 10^{11}$ | $3.53 \times 10^{17}$ | $1.31 \times 10^{23}$ | $2.89 \times 10^{28}$ | $3.34 \times 10^{33}$ |

Figure 5A:
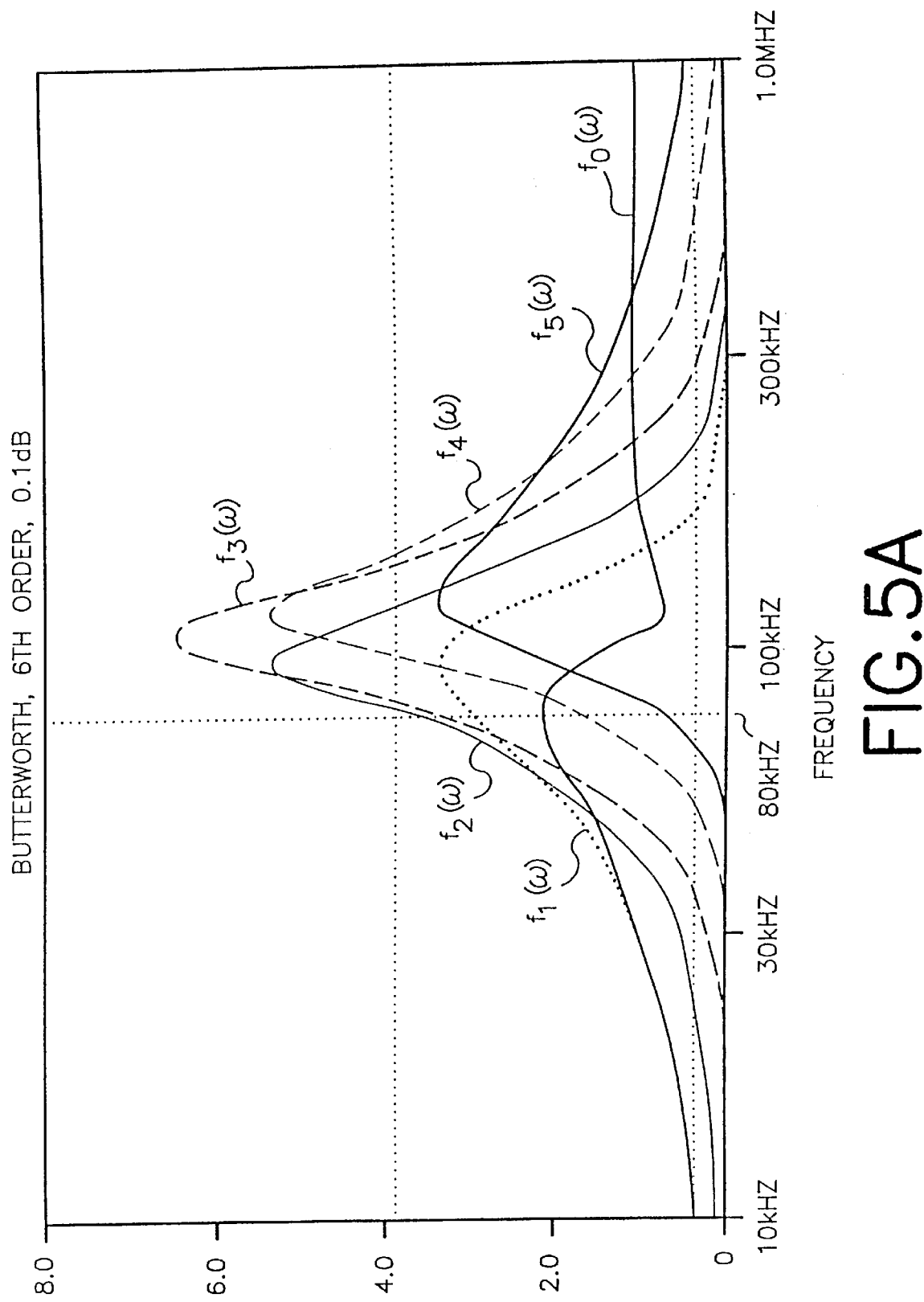
FIGS. 5A and 5B illustrate the frequency responses for a sixth-order Butterworth filter and a sixth-order Chebychev filter, respectively.
Figure 5B:
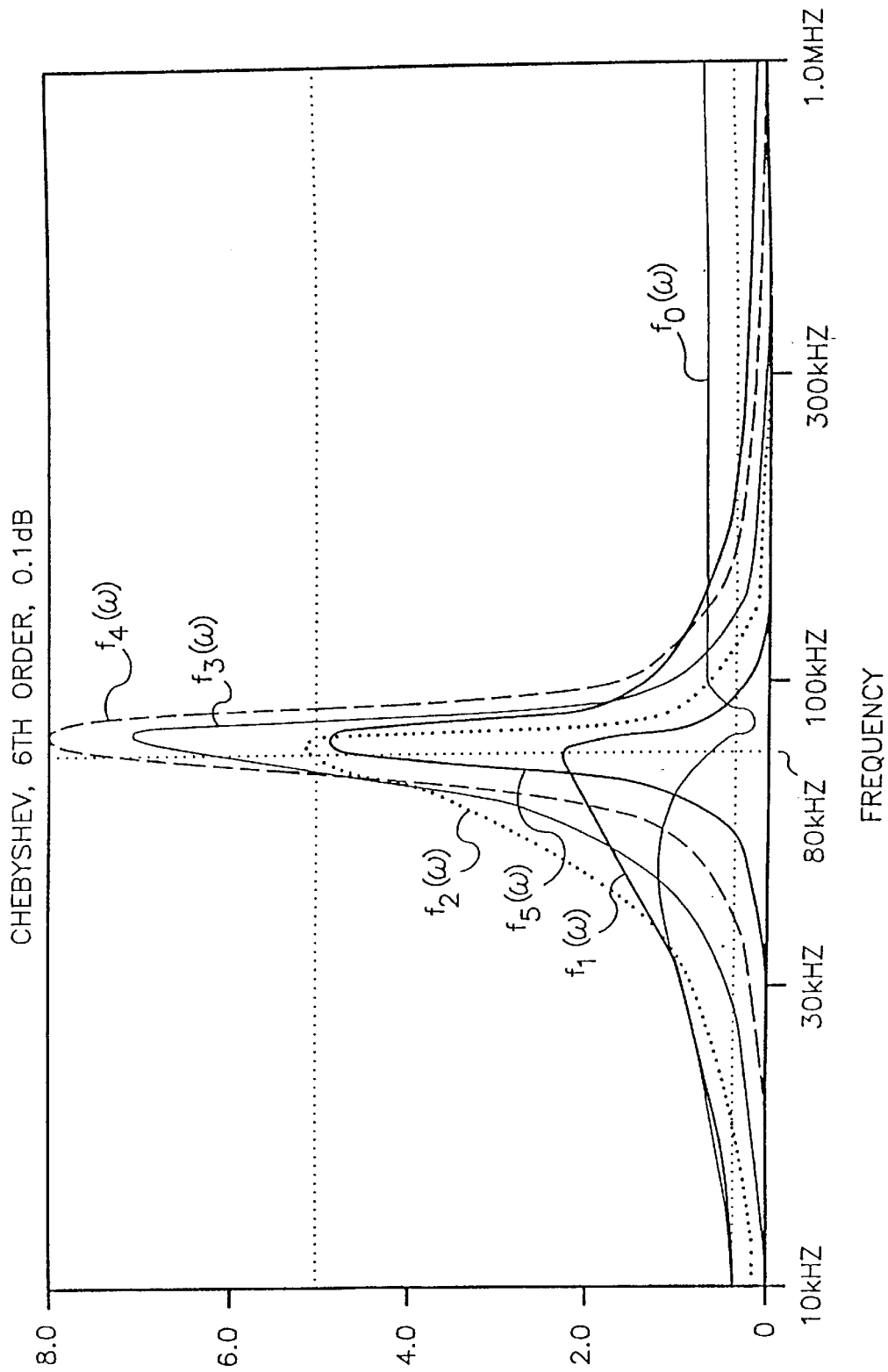

Calculating the corresponding coefficient-sensitivity functions $f_i(\omega)$, for i=0,1, ... 5, as in equations 27 and 28, the frequency response plots shown in FIGS. 5a and 5b are obtained. As in the third-order case (FIGS. 4a and 4b), the coefficient sensitivities for the Chebyshev filters are significantly higher (up to double) than those of the Butterworth filters. One reason for this is that the amplitude sensitivity is proportional to the pole quality factors, and these are higher for the Chebyshev than for the Butterworth filter, as a comparison of Tables 2 (above) and 4 (below) shows. In fact, it will be shown below that the sensitivity of the coefficients to component values is also critically dependent on the pole quality factors. It should be noted that for the Butterworth filter, $\omega_p$ is constant (i.e., $687.598 \times 10^3$) for the thee biquad sections, because the poles of a Butterworth filter lie on a semicircle with radius $\omega_p$. For the Chebyshev filter, the poles lie on an ellipse. Therefore, the $\omega_p$ values differ for each biquad section.

TABLE 4

Pole frequency and Q (i.e., ωp and qp) for the three pole pairs of a 6th order lowpass filter.

| Filter Type | Section no. | qp | ωp |
| --- | --- | --- | --- |
| Butterworth | 1 | 0.518 | 687.598 × 10³ |
| (0.1 dB ripple) | 2 | 0.707 | 687.598 × 10³ |
|  | 3 | 1.93 | 687.598 × 10³ |
| Chebyshev | 1 | 0.599 | 257.956 × 10³ |
| (0.1 dB ripple) | 2 | 1.33 | 419.460 × 10³ |
|  | 3 | 4.63 | 534.184 × 10³ |

It should be noted( that the frequency dependent sensitivity functions $f_i(\omega)$ plotted in FIGS. 4a–b and 5a–b depend only on the generic filter type (e.g., Chebyshev or Butterworth) but not on the actual circuit used to realize the filter. Thus, they depend on the given filter specifications and on the umpired filter order. This, in turn, will affect the filter cost, since the number of required filter components generally depends on the filter order. Economics aside, however, the sensitivity functions shown demonstrate a direct dependence of sensitivity on the quality factors of the transfer function poles: the higher the pole quality factors the higher the sensitivity.

Figure 6:
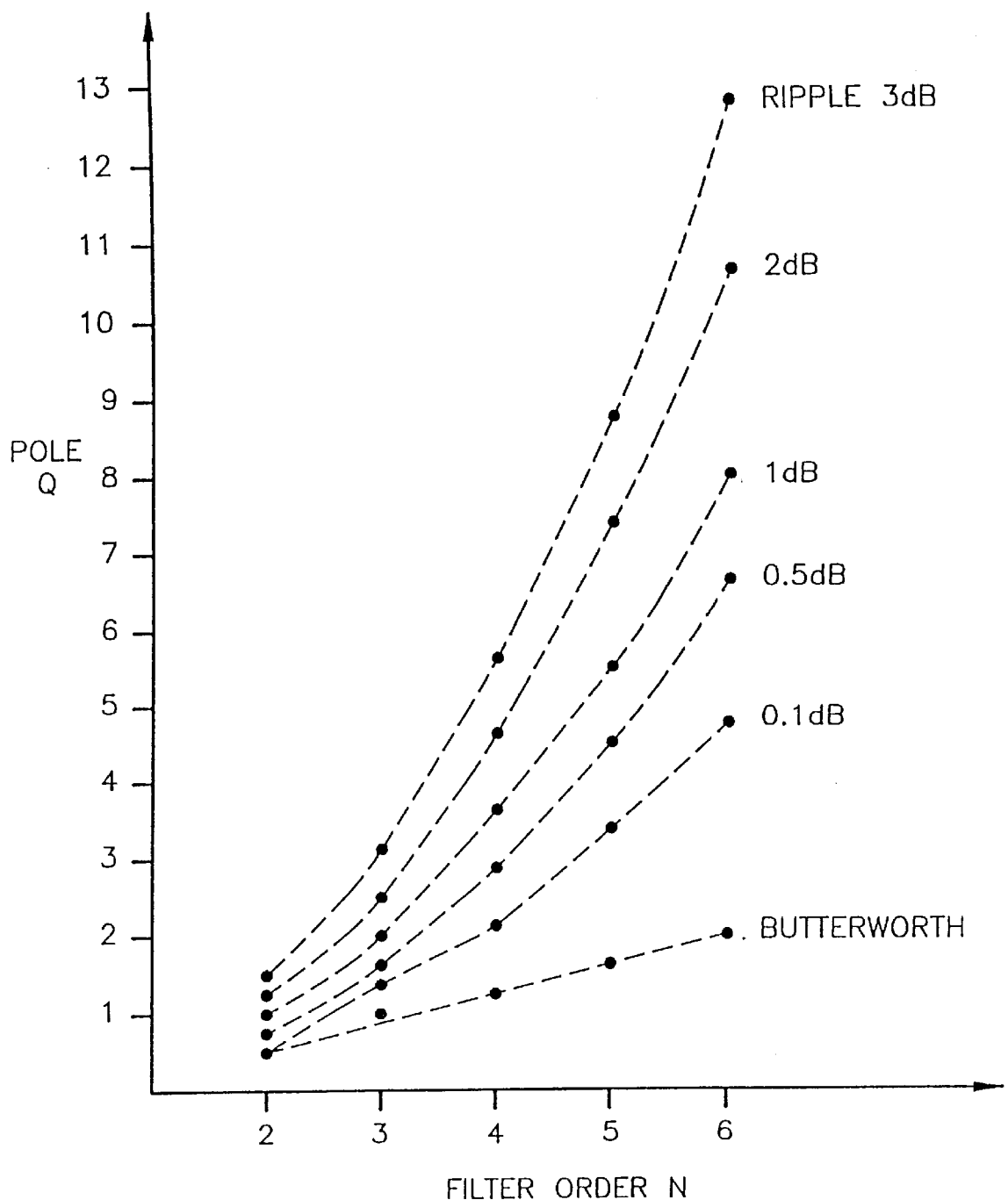
FIG. 6 graphically compares the ripple for Butterworth and Chebychev filters as a function of second through sixth order as a function of pole quality factor.

Therefore, it can be concluded that in order to design a second order filter with low sensitivity to its component values, a second order filter with the lowest possible pole quality factors (consistent with the filter specifications) should be used. Thus, for example, with respect to sensitivity, a second order Butterworth filter is preferable to a second order Chebyshev filter and, likewise, a low-ripple second order Chebyshev filter is preferable to a second order Chebyshev filter with higher ripple. This is illustrated in FIG. 6 where the highest pole Q of 2nd to 6th-order Butterworth and Chebyshev filters of varying-ripple is shown. FIG. 6 clearly indicates that in order to keep the pole quality factors at a minimum for the sake of low filter sensitivity to coefficient variations, it is desirable to design the filter with as low ripple and as low order as is consistent with the filter specifications.

SENSITIVITY OF THE COEFFICIENTS TO COMPONENT VARIATIONS

As demonstrated above, the variation of the amplitude response $\alpha(\omega)$ of an allpole filter (i.e., no finite zeros) caused by changes in the coefficients $a_i$ of the corresponding filter transfer function is given by:

$$\Delta \alpha(\omega) = \sum_{i=0}^{n} f_i(\omega) \frac{\Delta a_i}{a_i} \quad \text{(Eq. 34)}$$

where the frequency functions $f_i(\omega)$ depend only on the type of filter used (e.g., Chebyshev, Butterworth, etc.). On the other hand, the coefficient variations $\Delta a_i/a_i$ depend on the circuit type used to design the filter (e.g., positive or negative feedback, etc.) and on the values of the circuit components used to obtain a given transfer function T(s), such as that given by equation 1. Furthermore, it has been shown above that variations in the frequency dependent functions $f_i(\omega)$ and in the coefficients $\Delta a_i/a_i$ will be all the larger the higher the pole Qs of the filter. Consequently, the passband ripple will also be larger the higher the pole Q's are (see FIG. 6).

Figure 7:
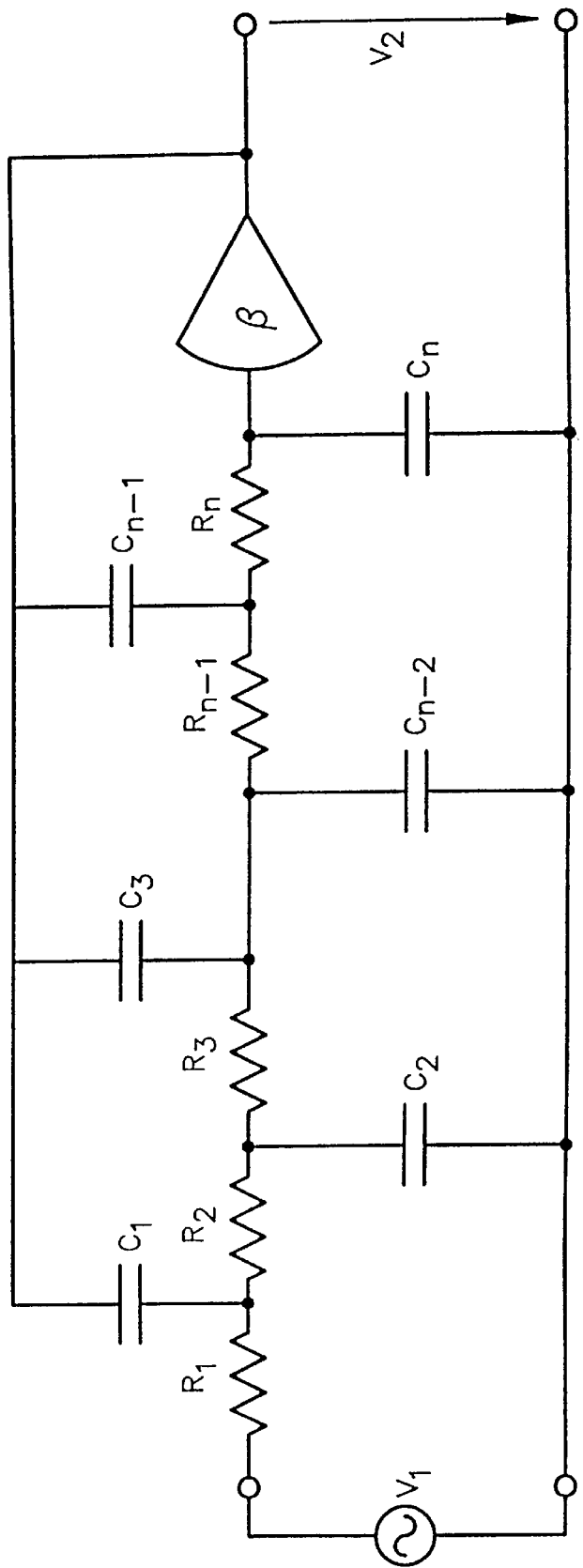
FIG. 7 illustrates an nth-order allpole single-amplifier filter circuit.

The sensitivity of the coefficients $a_i$ to variations of the circuit components (i.e., the resistors, capacitors, and amplifiers) making up the filter will now be examined. For the purpose of illustration, the representative nth-order general allpole single-amplifier filter structure shown in FIG. 7 will be used to illustrate the sensitivity of the transfer function coefficients to component value variations. This is a lowpass filter, but any other filter (e.g., highpass or bandpass) could also be used for this purpose. The transfer function of this filter will have the form of equation 1. The amplitude variation due to coefficient variations is given by equation 34 above. The coefficients $a_i$ are functions of the resistors, the capacitors and the gain β. Thus, using equation 3, the coefficient variations can be expressed in the form:

$$\frac{\Delta a_i}{a_i} = \sum_{\mu=1}^{r} S_{R_\mu}^{a_i} \frac{\Delta R_\mu}{R_\mu} + \sum_{\nu=1}^{c} S_{C_\nu}^{a_i} \frac{\Delta C_\nu}{C_\nu} + S_\beta^{a_i} \frac{\Delta \beta}{\beta} \quad \text{(Eq. 35)}$$

In general, the individual resistors $R_\mu$, capacitors $C_\nu$, and gain-determining resistors will be characterized by their mean $\mu_x$, and standard deviation $\sigma_x$, where x represents each of the component types (e.g., resistors or capacitors). The coefficient variations $\Delta a_i/a_i$ will then be random variables whose statistical behavior is a function of the components on which they depend.

In what follows, the coefficient-to-component sensitivity is derived analytically for the second order allpole filters. The resulting expressions provide insight into the methods of the present invention for deterministically reducing this sensitivity. To examine the efficacy of these methods, data obtained from testing using P SPICE Monte Carlo analysis with given component statistics will be provided. It will thus be shown that the method of the present invention for minimizing the sensitivity of second order filters is indeed very effective in reducing frequency response variations caused by component value variations.

Figure 8A:
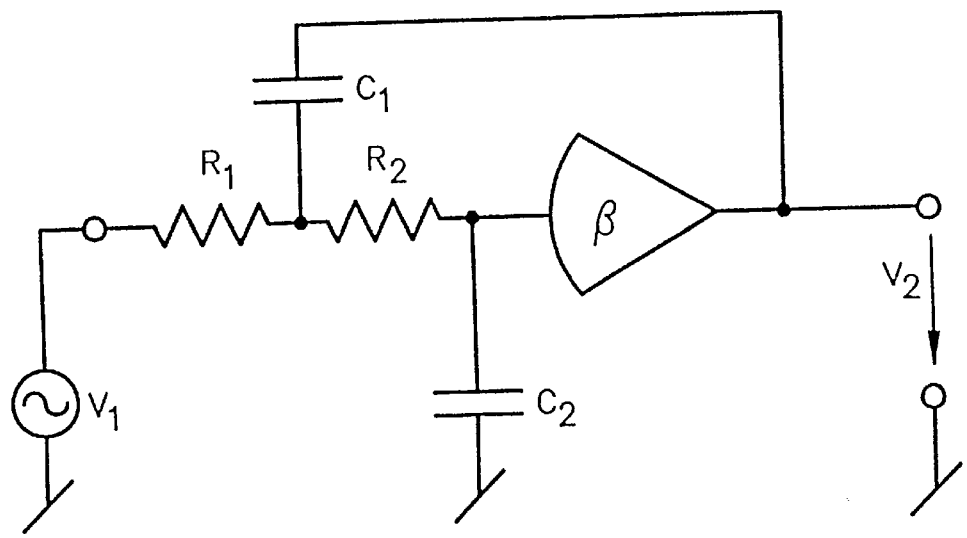
FIG. 8A illustrates a second order lowpass filter circuit comprising an ideal noninverting voltage amplifier.
Figure 8B:
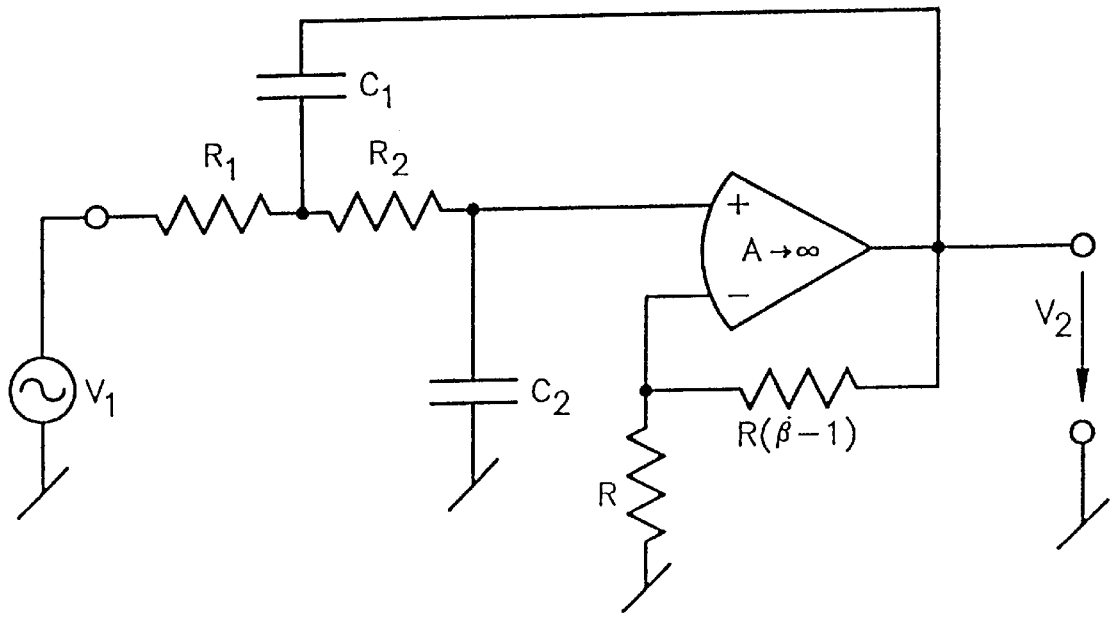
FIG. 8B illustrates a second order lowpass filter circuit comprising an ideal noninverting operational amplifier.

FIG. 8a illustrates a second-order lowpass filter. In FIG. 8b, the ideal noninverting voltage amplifier with gain β of FIG. 8a has been replaced by an ideal noninverting operational amplifier.

The voltage transfer function for this circuit (known as class 4 or Sallen and Key) expressed in terms of the coefficients $a_i$ is given by:

$$T(s) = \frac{\beta a_0}{s^2 + a_1 s + a_0} \quad \text{(Eq. 36)}$$

and in terms of the pole frequency $\omega_p$ and pole Q, $q_p$, by:

$$T(s) = \frac{\beta \omega_p^2}{s^2 + \frac{\omega_p}{q_p} s + \omega_p^2} \quad \text{(Eq. 37)}$$

where $$a_0 = \omega_p^2 = \frac{1}{R_1 R_2 C_1 C_2} \quad \text{(Eq. 38)}$$

and $$a_1 = \frac{\omega_p}{q_p} = \frac{R_1(C_1 + C_2) + R_2 C_2 - \beta R_1 C_1}{R_1 R_2 C_1 C_2} \quad \text{(Eq. 39)}$$

Considering the overall variation of coefficient $a_o$, the following is obtained from the general expression of equation 35:

$$\frac{\Delta a_0}{a_0} = \sum_{\mu=1}^{2} S_{R_\mu}^{a_0} \frac{\Delta R_\mu}{R_\mu} + \sum_{\nu=1}^{2} S_{C_\nu}^{a_0} \frac{\Delta C_\nu}{C_\nu} + S_\beta^{a_0} \frac{\Delta \beta}{\beta} \quad \text{(Eq. 40)}$$

With the sensitivity expressions of equations 13–19 it follows that:

$$\frac{\Delta a_0}{a_0} = -\left( \sum_{\mu=1}^{2} \frac{\Delta R_\mu}{R_\mu} + \sum_{\nu=1}^{2} \frac{\Delta C_\nu}{C_\nu} \right) \quad \text{(Eq 43)}$$

and $$\frac{\Delta \omega_p}{\omega_p} = \frac{1}{2} \frac{\Delta a_0}{a_0} \quad \text{(Eq. 44)}$$

Furthermore, the mean of $\Delta a_0/a_0$ will equal the negative sum of the means of all $R_\mu$ and $C_\nu$ and the variance will be the positive sum of their variances. Note that since the sensitivity of $a_0$ to all components x is -1 (and to the gain $\beta$, it is zero), there is nothing that can be done with regard to circuit design that will effect the component sensitivity of $a_0$. The only possible measures which can be used to decrease $\Delta a_0/a_0$ are technological, i.e., $\Delta a_0/a_0$ can be decreased only by prescribing the quality, precision, temperature coefficient, aging behavior, etc., of the resistors and capacitors. This conclusion is true for all filters of the type shown in FIG. 7, regardless of their order n.

Next, the variation of $a_1$ due to component values will be considered. From equation 35, the following is obtained:

$$\frac{\Delta a_1}{a_1} = \sum_{\mu=1}^{2} S_{R_\mu}^{a_1} \frac{\Delta R_\mu}{R_\mu} + \sum_{\nu=1}^{2} S_{C_\nu}^{a_1} \frac{\Delta C_\nu}{C_\nu} + S_\beta^{a_1} \frac{\Delta \beta}{\beta} \quad \text{(Eq. 45)}$$

With Equation 39 and the expressions of equations 13–19, the following is obtained:

$$S_{R_1}^{a_1} = -\frac{1}{a_1 R_1 C_1} \quad \text{(Eq. 46)}$$

$$= -q_p \sqrt{\frac{R_2 C_2}{R_1 C_1}}$$

In the second part of equation 46, the fact that $a_1 = \omega_p/q_p$ and that $\omega_p = (R_1 R_2 C_1 C_2)^{-1/2}$ has been utilized. Similarly, for the sensitivities of $a_1$ to the remaining components, the following is obtained:

$$S_{R_2}^{a_1} = -\frac{1}{a_1 R_2 C_2}\left(1 + \frac{C_2}{C_1} - \beta\right) \quad \text{(Eq. 47)}$$

$$= q_p \sqrt{\frac{R_1 C_1}{R_2 C_2}} \left(1 + \frac{C_2}{C_1} - \beta\right)$$

$$S_{C_1}^{a_1} = -\frac{1}{a_1}\left(\frac{1}{R_1 C_1} + \frac{1}{R_2 C_1}\right) \quad \text{(Eq. 48)}$$

$$= -q_p \left( \sqrt{\frac{R_1 C_2}{R_2 C_1}} + \sqrt{\frac{R_2 C_2}{R_1 C_1}} \right)$$

$$S_{C_2}^{a_1} = -\frac{1}{a_1} \frac{R_1 C_1 (1-\beta)}{R_1 R_2 C_1 C_2} \quad \text{(Eq. 49)}$$

$$= -q_p \sqrt{\frac{R_1 C_1}{R_2 C_2}} (1 - \beta)$$

$$S_\beta^{a_1} = S_\beta^{\omega_p} - S_\beta^{q_p} \quad \text{(Eq. 50)}$$

$$= -S_\beta^{q_p}$$

The last expression results from equation 38, since $\omega_p$ is independent of $\beta$. Calculating $q_p$ from equations 38 and 39, the following is obtained:

$$q_p = \frac{\kappa_1}{\kappa_2 - \beta \kappa_3} \quad \text{(Eq. 51)}$$

where $$\kappa_1 = \sqrt{R_1 R_2 C_1 C_2} \quad \text{(Eq. 52)}$$

Denoting the pole Q of the passive network (i.e. $\beta=0$) by q, i.e., $$\hat{q} = q_p(\beta = 0) = \frac{\kappa_1}{\kappa_2} \quad \text{(Eq. 55)}$$

equation 56 is obtained from the sensitivity expressions of equations 13–19:

$$S_\beta^{q_p} = \frac{q_p}{\hat{q}} - 1 \quad \text{(Eq. 56)}$$

and $$S_\beta^{a_1} = -\left(\frac{q_p}{\hat{q}} + 1\right) \quad \text{(Eq. 57)}$$

The coefficient sensitivities given above are all proportional to the pole Q, $q_p$. Thus, in deciding on a filter type for a given application, preferably the one yielding the lowest pole Qs will be selected. This means that a low ripple or maximally flat filter should be used if possible, with as low a filter degree n as the specifications will allow (see FIG. 6).

From equations 56 and 57 it follows that the coefficient (or $q_p$) sensitivity to the gain is inversely proportional to the passive RC pole Q, q. Thus, q should be as large as possible. Since a passive RC network can have only negative-real, single poles, it follows that q is limited to less than 0.5. The upper bound of 0.5 cannot actually be reached, since this entails a component spread approaching infinity. This can be easily shown for the circuit of FIG. 7. From equations 51–54, the following expression is obtained:

$$\hat{q} = q_p(\beta = 0) = \frac{\kappa_1}{\kappa_2} = \frac{\sqrt{R_1 R_2 C_1 C_2}}{R_1 C_1 + R_2 C_2 + R_1 C_2} \quad \text{(Eq. 58)}$$

Inverting this expression, the following is obtained:

$$\frac{1}{\hat{q}} = \sqrt{\frac{R_1 C_1}{R_2 C_2}} + \sqrt{\frac{R_2 C_2}{R_1 C_1}} + \sqrt{\frac{R_1 C_2}{R_2 C_1}} \quad \text{(Eq. 59)}$$

Letting $$x = \sqrt{\frac{R_1 C_1}{R_2 C_2}} \quad \text{(Eq. 60)}$$

equation 59 takes on the form:

$$\frac{1}{\hat{q}} = x + \frac{1}{x} + \sqrt{\frac{R_1 C_2}{R_2 C_1}} \quad \text{(Eq. 61)}$$

Since the function $y = x + x^{-1}$ reaches its minimum value, namely 2, for $x=1$, it follows from equation 61 that for $R_1 C_1 = R_2 C_2$:

$$\frac{1}{\hat{q}} = 2 + \frac{C_2}{C_1} \quad \text{(Eq. 62)}$$

This quantity approaches its minimum value only when the capacitor spread $C_2/C_1$ approaches zero. In other words, the maximum value $q_{max}=0.5$ is reached only in the limit, as $C_2/C_1$ approaches zero and $R_1 C_1 = R_2 C_2$.

Figure 9:
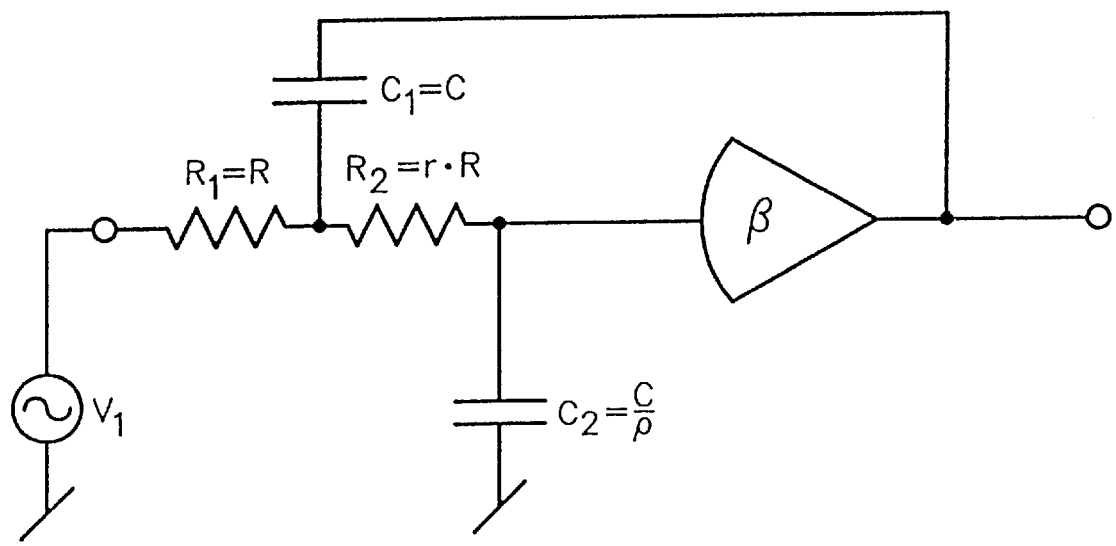
FIG. 9 corresponds to the filter circuit of FIG. 8$a$ redrawn with impedance scaling factors in accordance with the impedance tapering method of the present invention.

This result can be generalized as follows. It can be shown that the pole Q, q of an RC ladder-type structure can be maximized by impedance scaling the second L-section of the ladder so as to minimize the loading on the first L section. For example, referring to FIG. 8a, the second L-section comprising $R_2$ and $C_2$ can be impedance scaled upwards so as to minimize the loading on the first, i.e., on $R_1$ and $C_1$. Referring to FIG. 9, in which the active RC lowpass filter of FIG. 8a has been redrawn with impedance scaling factors r and ρ for $R_2$ and $C_2$, respectively, i.e., $$R_1 = R; \quad C_1 = C \quad \text{(Eq. 63)}$$
$$R_2 = rR; \quad C_2 = C/\rho$$

the following is obtained:

$$\hat{q} = \frac{\sqrt{r\rho}}{1 + r + \rho} \quad \text{(Eq. 64)}$$

and for r=ρ:

$$\hat{q} = \frac{\rho}{1 + 2\rho}\bigg|_{\rho \to \infty} = 0.5 \quad \text{(Eq. 65)}$$

Figure 10:
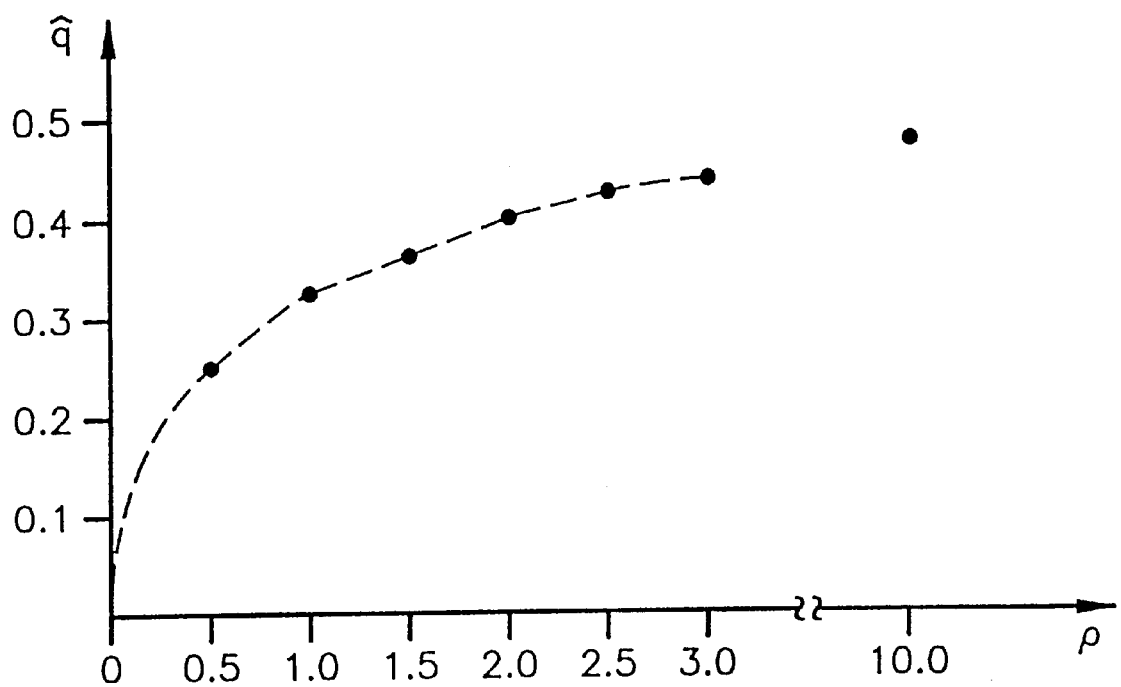
FIG. 10 graphically illustrates the effect the impedance tapering method of the present invention has on the pole quality factor.

Thus, impedance scaling $R_2$ and $C_2$ by a value of ρ>1, q will approach 0.5 and the sensitivity of $a_1$ (or $q_p$) to β will, according to equation 56, be minimized. In accordance with the present invention, it has been determined that ρ does not have to be that much larger than unity to be effective, as the plot of q versus ρ shows in FIG. 10. This is fortunate since, in practice, a large ρ may cause $C_2$ to decrease into the range of the parasitic capacitance of the circuit. From FIG. 10 it is apparent that a value of ρ between 2 and 3 will bring q close to its upper boundary of 0.5.

It will now be shown that impedance scaling with a factor ρ>1 will also decrease the other coefficient sensitivities, given by equations 46–50. Inserting the expressions in equation 63 into equations 46 through 50, the sensitivity relations given below are obtained. Although ideal impedance scaling requires that r=ρ, this may not always be possible, since a given design may require two degrees of freedom, i.e., freedom in choosing both ρ and r. Both sets of expressions, namely those for r=ρ and for r≠ρ, are given below.

$$\left(S_{R_1}^{a_1} = -q_p \sqrt{\frac{r}{\rho}}\right)\bigg|_{r=\rho} = -q_p \quad \text{(Eq. 66)}$$

$$S_{R_2}^{a_1} = -q_p \left[\sqrt{\frac{\rho}{r}}(1-\beta) + \frac{1}{\sqrt{\rho r}}\right]_{r=\rho} = -q_p\left(1 - \beta + \frac{1}{\rho}\right) \quad \text{(Eq. 67)}$$

$$S_{C_2}^{a_1} = q_p\left(\sqrt{\frac{r}{\rho}}(1-\beta)\right)_{r=\rho} - q_p\left(1 + \frac{1}{\rho}\right) \quad \text{(Eq. 68)}$$

$$\left(S_{C_2}^{a_1} = q_p \sqrt{\frac{\rho}{r}}(1-\beta)\right)\bigg|_{r=\rho} = -q_p(1-\beta) \quad \text{(Eq. 69)}$$

Clearly, ideal impedance scaling (in which case ρ=r>1) not only reduces the coefficient sensitivities to the gain β but also to the other components. If r is required to be unequal to ρ (for reasons of design flexibility), then increasing only the capacitor ratio p or, alternatively, increasing only r, will also reduce the sensitivities. Even though equations 67 and 69 include a term $(\rho/r)^{1/2}$ (1-β), this term will be small or zero, since the gain β will generally be in the range between unity and two.

Figure 11A:
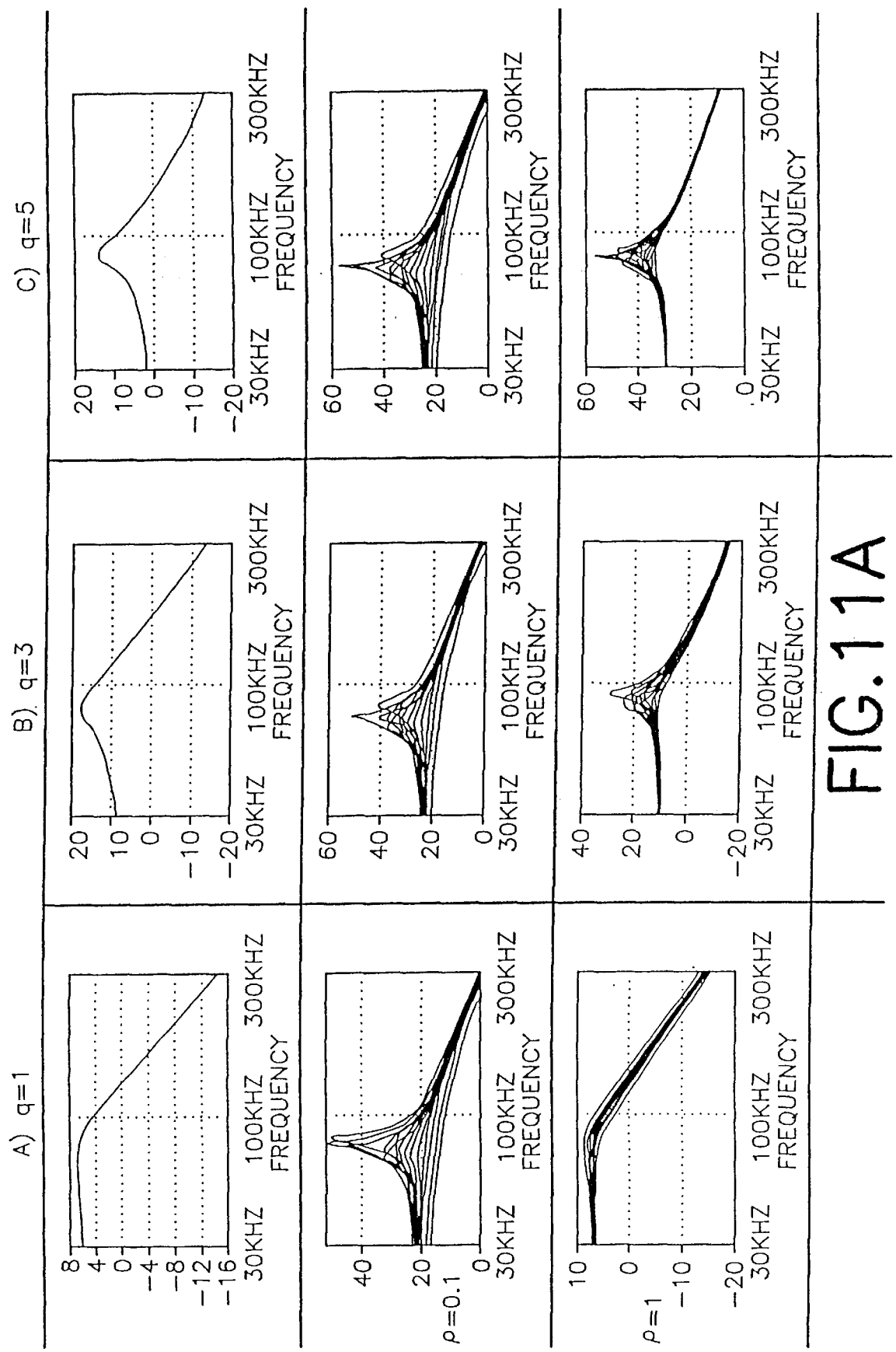
FIG. 11 illustrates amplitude response curves which demonstrate the effect the impedance tapering method of the present invention has on the sensitivity of filters.
Figure 11B:
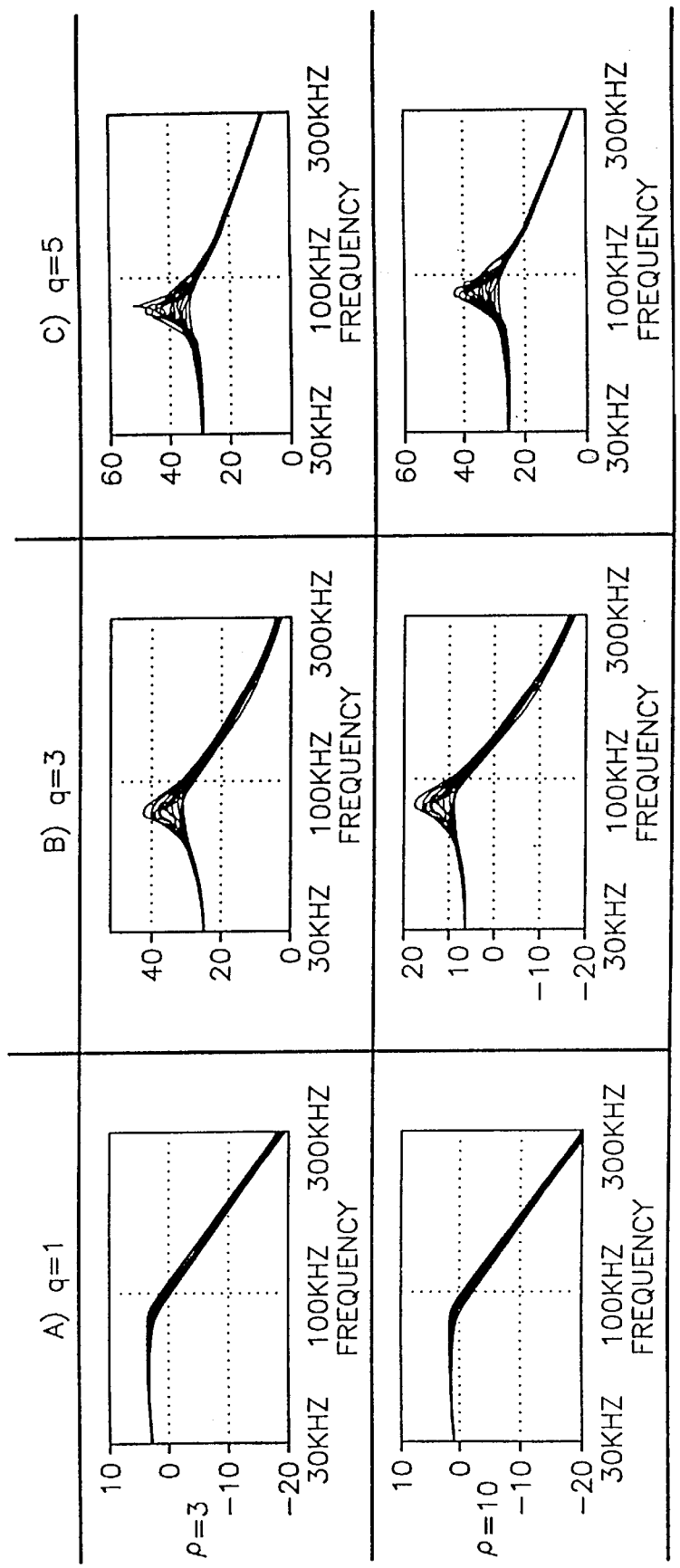

To demonstrate the effect of the impedance tapering method of the present invention, FIG. 11 shows P SPICE Monte Carlo runs of the circuit shown in FIG. 9 for p values ranging from 0.1 to 10, and $q_p$ values from 1 to 5. Comparing scenarios a), b) and c) in FIG. 11 for ρ=r=1, influence of the pole Q on component sensitivity for non-impedance scaled circuits is shown. As the pole quality factor is increased, the circuit becomes increasingly sensitive to component variations, which are uniformly distributed with zero mean and 5% tolerance. By impedance-scaling by a factor of only 3 (i.e. ρ=r=3), the sensitivities are decreased significantly. For ρ=r=10, the sensitivities are decreased even more. Conversely, when ρ=r=0.1, the high sensitivity of the circuits renders them practically useless. Curves are not shown here for r≠ρ, since, in general, second-order circuits do not require this added design flexibility.

It has been shown above that impedance tapering filters in accordance with the method of the present invention significantly decreases the frequency response sensitivity to component variations. Unfortunately, the tapering factors cannot be arbitrarily chosen because the degrees of freedom inherent in the design equations may not be sufficient to satisfy both the filter specifications and the selected tapering factors. Clearly, tapering factors that are as large as possible are preferable. In practice, however, the tapering factors may be limited by practical design considerations to values lower than about five. Nevertheless, even this much tapering will decrease the filter sensitivity considerably. It should be noted that the tapering factors are not limited by the present invention but are limited only by practical considerations of filter design, with the exception that the tapering factors must be greater than unity.

DESIGN EQUATIONS FOR THE SECOND ORDER FILTER

Having demonstrated that the sensitivity of second order filters can be minimized by using the impedance tapering method of the present invention, the design equations of the present invention used for designing a second-order lowpass filter, such as that shown in FIG. 8a, will now be provided. For convenience, the transfer function for the filter of FIG. 8a is repeated here as:

$$T(s) = \frac{Ka_0}{s^2 + a_1 s + a_0} \quad \text{(Eq. 70)}$$

$$= \frac{K \cdot \omega_p^2}{s^2 + \frac{\omega_p}{q_p} s + \omega_p^2}$$

where, instead of the amplifier gain $\beta$, the more general factor K is used, and $$a_0 = \omega_p^2 = \frac{1}{R_1 R_2 C_1 C_2} \quad \text{(Eq. 71)}$$

and $$a_1 = \frac{\omega_p}{q_p} = \frac{R_1(C_1 + C_2) + R_2 C_2 - \beta R_1 C_1}{R_1 R_2 C_1 C_2} \quad \text{(Eq. 72)}$$

Referring to FIG. 9 and letting $R_1 = R \quad C_1 = C$ $R_2 = rR \quad C_2 = C/\rho$ \quad (Eq. 73)

and $$\omega_0 = \frac{1}{RC} \quad \text{(Eq. 74)}$$

This results in $$a_0 = \omega_p^2 = \frac{\rho}{r} = \omega_0^2 \quad \text{(Eq. 75)}$$

$$a_1 = \frac{\omega_p}{q_p} = \omega_0 \frac{\rho}{r}\left(1 + \frac{1+r}{\rho} - \beta\right) \quad \text{(Eq. 76)}$$

and $$\beta = 1 + \frac{1+r}{\rho} - \frac{1}{q_p}\sqrt{\frac{r}{\rho}} \quad \text{(Eq. 77)}$$

In practice K, $a_0$ and $a_1$ or, equivalently, K, $\omega_p$ and $q_p$ will be given by the filter specifications. From these quantities, and possibly some additional constraints, such as input resistance level, maximum or minimum acceptable capacitor values, etc., $\omega_0$, $\rho$, r and $\beta$ are determined, as discussed in more detail below.

From equations 75–77, the following expressions are obtained:

$$r = \frac{\omega_0^2}{(a_1 - \omega_0)\omega_0 + a_0(\beta - 1)} \quad \text{and} \quad \text{(Eq. 78)}$$

$$\rho = \frac{ra_0}{\omega_0^2} = \frac{a_0}{(a_1 - \omega_0)\omega_0 + a_0(\beta - 1)} \quad \text{(Eq. 79)}$$

r and $\rho$ must be positive, and $\beta$ which is the gain of a noninverting opamp, must obey the constraint $\beta \geq 1$ \quad (Eq. 80)

Thus, the denominator of equations 78 and 79 must be larger than zero, resulting in the constraint, that $$\omega_0 < \frac{a_1}{2} + \sqrt{\frac{a_1^2}{4} + a_0(\beta - 1)} \quad \text{(Eq. 81)}$$

Because of equation 80, the expression under the square root in equation 81 will always be positive.

METHOD OF THE PRESENT INVENTION FOR DESIGNING SECOND ORDER FILTERS

Using equations 71–81 above, the second-order filter is designed as follows. First, the transfer function coefficients ($a_0$, $a_1$) and the gain ($\beta$) for the filter to be designed are obtained from the filter specifications (e.g., from a filter handbook or CAD program). The value of the filter design radian frequency, $\omega_0$, is then obtained from equation 75 using the value of $a_0$ obtained from the filter specifications. Using equation 78, the value of the resistor tapering factor, r, is calculated using the known values of $a_0$, $\omega_0$ and $\beta$. Next, the value of the capacitor tapering factor, $\rho$, is calculated using equation 75 and the known values of r and either $\omega_0$ or $a_0$. Alternatively, the capacitor tapering factor, $\rho$, can be calculated using equation 79 and the known values of $a_0$, $\omega$ and the value of the resistor tapering factor, r, can be calculated using equation 75 and the known values of $\omega_0$, $\rho$ and $a_0$.

Once these values have been calculated, either $R_1$ or $C_1$ is selected in accordance with practical design considerations, which are understood by those of ordinary skill in the art. If the value of $R_1$ is selected, the value of $C_1$ is calculated using equation 74. The values for $R_2$ and $C_2$ are then obtained using equation 73. Alternatively, the value for $C_1$ can be selected and then the values of $R_1$, $R_2$ and $C_2$ are calculated using equations 74 and 73, respectively.

It should be noted that the present invention has been described with respect to the preferred embodiments but that the present invention is in no way limited to these embodiments. It will also be apparent to those skilled in the art after reading the present application that the concepts and methods of the present invention apply generally to the art of filter design and are not limited to the embodiments discussed above. It will also be apparent to those skilled in the art that modifications to the methods discussed above can be made which are within the spirit and scope of the present invention.

What is claimed is:

1. A second order filter having low sensitivity to filter component values, said filter comprising:

a first filter section having a first resistor and a first capacitor, said first resistor having a first end and a second end, said first capacitor having a first end and a second end, said second end of said first resistor being electrically coupled to said first end of said first capacitor, said first resistor having a value of $R_1$, said first capacitor having a value of $C_1$; and a second filter section having a second resistor and a second capacitor, said second resistor having a first end and a second end, mid second capacitor having a first end and a second end, said first end of said second resistor being electrically coupled to said second end of said first resistor and to said first end of Aid first capacitor, said second end of said second resistor being electrically coupled to said first end of said second capacitor, said second rotor having a value of $R_2$, wherein $R_2 = R_1 \times r$, said second capacitor having a value of $C_2$, wherein $C_2 C_1/\rho$, and wherein r and $\rho$ are both greater than 1 and substantially less than 10.

2. The filter of claim 1 wherein $r=\rho$.

3. A second order filter having low sensitivity to filter component values, said filter comprising:

a first filter section having a first motor and a first capacitor, said first resistor having a first end and a second end, said first captor having a first end and a second end, said second end of said first resistor being electrically coupled to said first end of said first captor, said first resistor having a value of $R_1$, said first capacitor having a value of $C_1$;

a second filter section having a second resistor and a second capacitor said second resistor having a first end and a second end, said second capacitor having a first end and a second end, said first end of said second resistor being electrically coupled to said second end of said first resistor and to said first end of said first capacitor, said second end of said second resistor being electrically coupled to said first end of said second capacitor, said second resistor having a value of $R_2$, wherein $R_2 = R_1 \times r$, said second capacitor having a value of $C_2$, wherein $C_2 = C_1/\rho$, and wherein r and $\rho$ are both greater than 1 and substantially less than 10; and an amplifier having an input terminal and an output terminal, the output terminal being electrically coupled to said second end of said first capacitor, the input terminal being electrically coupled to the second end of said second resistor and to said first end of said second capacitor.

4. The filter of claim 3 wherein $r=\rho$.

5. A second order filter having low sensitivity to filter component values, said filter comprising:

a first filter section having a first resistor and a first capacitor, said first resistor having a first end and a second end, said first capacitor having a first end and a second end, said second end of said first resistor being electrically coupled to said first end of said first captor, said first resistor having a value of $R_1$, said first capacitor having a value of $C_1$;

a second filter section having a second resistor and a second capacitor, said second resistor having a first end and a second end, said second capacitor having a first end and a second end, said first end of said second resistor being electrically coupled to said second end of said first resistor and to said first end of said first capacitor, said second end of said second resistor b electrically coupled to said first end of said second capacitor, said second resistor having a value of $R_2$. wherein $R_2 = R_1 \times r$, said second capacitor having a value of $C_2$ wherein $C_2 = C_1/\rho$, and wherein r is greater than 1 and substantially less than 10 and wherein $r=\rho$; and an amplifier having an input terminal and an output terminal, the output terminal being electrically coupled to sad second end of said first capacitor, the input terminal being electrically coupled to the second end of said second resistor and to said first end of said second capacitor.

6. A method for designing a second order filter with low sensitivity to component values, said method comprising the steps of:

selecting transfer function coefficients, $a_0$, $a_1$, and gain, $\beta$ for the second order filter to be designed from a suitable filter specifications reference;

calculating a filter frequency, $\omega_0$, based on the value of $a_0$;

calculating a resistor tapering factor, r, based on the values of $a_0$, $a_1$, $\omega_0$ and $\beta$, wherein r is greater than 1 and substantially less than 10;

calculating a capacitor tapering factor, $\rho$, base on the values of $a_0$, $a_1$, $\omega_0$ and $\beta$, wherein $\rho$ is greater than 1 and substantially less than 10;

selecting a resistor value, $R_1$, for a resistor of a first ladder section of the second order filter;

calculating a capacitor value, $C_1$, for a capacitor of the first ladder section of the second order filter based on the values $R_1$ and $\omega_0$;

calculating a resistor value, $R_2$, for a resistor of a second ladder section of the second order filter, wherein the value $R_2$ is equal to $R_1$ multiplied by r, calculating a capacitor value, $C_2$, for a capacitor of the second ladder section of the second order filter, wherein the value $C_2$ is equal to $C_1$ divided by $\rho$; and outputting the values for $R_1$, $C_1$, and $C_2$ in a legible format.

7. The method of claim 6 wherein r is equal to $\rho$.

8. A method for designing a second order filter with low sensitivity to component values, said method comprising the steps of:

selecting transfer function coefficients, $a_0$, $a_1$, and gain, $\beta$, for the second order filter to be designed from a suitable filter specifications reference;

calculating a filter design frequency, $\omega_0$, based on the value of $a_0$;

calculating a resistor tapering factor, r, based on the values of $a_0$, $a_1$, $\omega_0$ and $\beta$;

calculating a capacitor tapering factor, $\rho$, based on the values of $a_0$, $a_1$, $\omega_0$ and $\beta$;

selecting a capacitor value, $C_1$, for a capacitor of a first ladder section of the second order filter;

calculating a resistor value, $R_1$, for a resistor of the first ladder section of the second order filter based on the values $C_1$ and $\omega_0$;

calculating a resistor value, $R_2$, for a resistor of a second ladder section of the second order filter, wherein the value $R_2$ is equal to $R_1$ multiplied by r, wherein r is greater than 1 and substantially less than 10;

calculating a capacitor value, $C_2$, for a capacitor of the second ladder section of the second order filter, wherein the value $C_2$ is equal to $C_1$ divided by $\rho$, wherein $\rho$ is greater than 1 and substantially less than 10; and outputting the values for $R_1$, $C_1$, $R_2$ and $C_2$ in a legible format.

9. The method of claim 8 wherein r is equal to $\rho$.

10. A method for designing a second order filter with low sensitivity to component values, said method comprising the steps of:

selecting transfer function coefficients, $a_0$, $a_1$, and gain, $\beta$, for the second order filter to be designed from a suitable filter specifications reference;

calculating a filter design frequency, $\omega_0$, based on the value of $a_0$;

calculating a resistor tapering factor, r, based on the values of $a_0$, $a_1$, $\omega_0$ and $\beta$, wherein r is greater than 1 and substantially less than 10;

selecting a capacitor tapering factor, $\rho$, equal to r;

selecting a resistor value, $R_1$, for a resistor of a first ladder section of the second order filter, calculating a capacitor value, $C_1$, for a capacitor of the first ladder section of the second order filter based on the values $R_1$ and $\omega_0$;

calculating a resistor value, $R_2$, for a resistor of a second ladder section of the second order filter, wherein the value $R_2$, is equal to $R_1$ multiplied by r;

calculating a capacitor value, $C_2$, for a capacitor of the second ladder section of the second order filter, wherein the value $C_2$ is equal to $C_1$ divided by $\rho$; and outputting the values for $R_1$, $C_1$, $R_2$ and $C_2$ in a legible format.

11. A method for designing a second order filter with low sensitivity to component values, said method comprising the steps of;

selecting transfer function coefficients, $a_0$, $a_1$, and gain, $\beta$, for the second order filter to be designed from a suitable filter specifications reference;

calculating a filter design frequency, $\omega_0$, based on the value of $a_0$;

calculating a resistor tapering factor, r, based on the values of $a_0$, $a_1$, $\omega_0$ and $\beta$;

selecting a capacitor tapering factor, $\rho$, equal to r;

selecting a capacitor value, $C_1$, for a capacitor of a first ladder section of the second order filter;

calculating a resistor value, $R_1$, for a resistor of the first ladder section of the second order filter based on the values $C_1$ and $\omega_0$;

calculating a resistor value, $R_2$, for a resistor of a second ladder section of the second order filter, wherein the value $R_2$ is equal to $R_1$ multiplied by r, wherein r is greater than 1 and substantially less than 10;

calculating a capacitor value, $C_2$, for a capacitor of the second ladder section of the second order filter, wherein the value $C_2$ is equal to $C_1$ divided by $\rho$; and outputting the values for $R_1$, $C_1$, $R_2$ and $C_2$ in a legible format.

12. A method for designing a second order filter with low sensitivity to component values, said comprising the steps of:

selecting transfer function coefficients, $a_0$, $a_1$, and gain $\beta$, for the second order filter to be designed from a suitable filter specifications reference;

calculating a filter design frequency, $\omega_0$, based on the value of $a_0$;

calculating a capacitor tapering factor, $\rho$, based on the values of $a_0$, $a_1$, $\omega_0$ and $\beta$, wherein $\rho$ is greater than 1 and substantially less than 10;

selecting a resistor tapering factor, r, equal to $\rho$;

selecting a capacitor value, $C_1$, for a capacitor of a first ladder section of the second order filter;

calculating a resistor value, $R_1$, for a resistor of the first ladder section of the second order filter based on the values $C_1$ and $\omega_0$;

calculating a resistor value, $R_2$, for a resistor of a second ladder section of the second order filter, wherein the value $R_2$ is equal to $R_1$ multiplied by r;

calculating a capacitor value, $C_2$, for a capacitor of the second ladder section of the second order filter, wherein the value $C_2$ is equal to $C_1$ divided by $\rho$; and outputting the values for $R_1$, $C_1$, $R_2$ and $C_2$ in a legible format.

13. A method for designing a second order filter with low sensitivity to component values, said method comprising the steps of:

selecting transfer function coefficients, $a_0$, $a_1$, and gain, $\beta$, for the second order filter to be designed from a suitable filter specifications reference;

calculating a filter design frequency, $\omega_0$, based on the value of $a_0$;

calculating a resistor tapering factor, r, based on the values of $a_0$, $a_1$, $\omega_0$ and $\beta$;

calculating a capacitor tapering factor, $\rho$, based on the values of $a_0$, $a_1$, $\omega_0$ and $\beta$;

selecting a capacitor value, $C_1$, for a capacitor of a first ladder section of the second order filter;

calculating a resistor value, $R_1$, for a resistor of the first ladder section of the second order filter based on the values $C_1$ and $\omega_0$; calculating a resistor value, $R_2$, for a resistor of a second ladder section of the second order filter, wherein the value $R_2$ is equal to $R_1$ multiplied by r, wherein r is greater than 1 and substantially less than 10;

calculating a capacitor value, $C_2$, for a capacitor of the second ladder section of the second order filter, wherein the value $C_2$ is equal to $C_1$ divided by $\rho$, wherein $\rho$ is equal than 1 and substantially less than 10; and constructing the second order filter using the values for $R_1$, $C_1$, $R_2$ and $C_2$.

14. A method for designing i second order filter with low sensitivity to component values, said method comprising the steps of;

selecting transfer function coefficients, $a_0$, $a_1$, and gain, $\beta$, for the second order filter to be designed from a suitable filter specifications reference;

calculating a filter design frequency, $\omega_0$, based on the value of $a_0$;

calculating a resistor tapering factor, r, based on the values of $a_0$, $a_1$, $\omega_0$ and $\beta$, wherein r is greater than 1 and substantially less than 10;

selecting a capacitor tapering factor, $\rho$, equal to r;

selecting resistor value, $R_1$, for a resistor of a first ladder section of the second order filter;

calculating a capacitor value, $C_1$, for a capacitor of the first ladder section of the second order filter band on the values $R_1$ and $\omega_0$;

calculating a resistor value, $R_2$, for a resistor of a second ladder section of the second order filter, wherein the value $R_2$ is equal to $R_1$ multiplied by r;

calculating a capacitor value, $C_2$, for a capacitor of the second ladder section of the second order filter, wherein the value $C_2$ is equal to $C_1$ divided by $\rho$; and constructing the second order filter using the values for $R_1$, $C_1$, $R_2$, and $C_2$.

15. A method for designing a second order filter with low sensitivity to component values, said method comprising the steps of:

selecting transfer function coefficients, $a_0$, $a_1$, and gain, $\beta$, for the second order filter to be designed from a suitable filter specifications reference;

calculating a filter design frequency, $\omega_0$, based on the value of $a_0$;

calculating a resistor tapering factor, r, based on the values of $a_0$, $a_1$, $\omega_0$ and $\delta$;

selecting a capacitor tapering factor, $\rho$, equal to r;

selecting a capacitor value, $C_1$, for a capacitor of a first ladder section of the second order filter;

calculating a resistor value, $R_1$, for a resistor of the first ladder section of the second order filter based on the values $C_1$ and $\omega_0$;

calculating a resistor value, $R_2$, for a resistor of a second ladder section of the second order filter, wherein the value $R_2$ is equal to $R_1$ multiplied by r, wherein r is greater than 1 and substantially less than 10; and calculating a capacitor value, $C_2$, for a capacitor of the second ladder section of the second order filter, wherein the value $C_2$ is equal to $C_1$ divided by $\rho$; and constructing the second order filter using the values for $R_1$, $C_1$, $R_2$, and $C_2$, constructing the second order filter using the values for $R_1$, $C_1$, $R_2$, and $C_2$.

16. A method for des a second order filter with low sensitivity to component values, said method comprising the steps of:

selecting transfer function coefficients, $a_0$, $a_1$, and gain, $\beta$, for the second order filter to be designed from a suitable filter specifications reference;

calculating a filter design frequency, $\omega_0$, based on the value of $a_0$;

calculating a capacitor tapering factor, $\rho$, based on the values of , $a_0$, $a_1$, $\omega_0$ and $\beta$, wherein $\rho$ is greater than 1 and substantially less than 10;

selecting a resistor tapering factor, r, equal to $\rho$;

selecting a capacitor value, $C_1$, for a capacitor of a first ladder section of the second order filter, calculating a resistor value, $R_1$, for a resistor of the first ladder section of the second order filter based on the values $C_1$ and $\omega_0$;

calculating a resistor value, $R_2$, for a resistor of a second ladder section of the second order filter, wherein the value $R_2$ is equal to $R_1$ multiplied by r;

calculating a capacitor value, $C_2$, for a capacitor of the second ladder section of the second order filter, wherein the value $C_2$ is equal to $C_1$, divided by $\rho$; and constructing the second order filter using the vales for $R_1$, $C_1$, $R_2$, and $C_2$.

* * * * *